US012513946B2

(12) United States Patent
Lin et al.

(10) Patent No.: US 12,513,946 B2
(45) Date of Patent: Dec. 30, 2025

(54) METHOD FOR FORMING A SEMICONDUCTOR DEVICE HAVING A 2-D MATERIAL CHANNEL OVER A SUBSTRATE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Shih-Yen Lin, New Taipei (TW); Po-Cheng Tsai, Taichung (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 857 days.

(21) Appl. No.: 17/691,977

(22) Filed: Mar. 10, 2022

(65) Prior Publication Data

US 2023/0088634 A1 Mar. 23, 2023

Related U.S. Application Data

(60) Provisional application No. 63/245,471, filed on Sep. 17, 2021.

(51) Int. Cl.
*H10D 30/67* (2025.01)
*H10B 43/27* (2023.01)
(Continued)

(52) U.S. Cl.
CPC ......... *H10D 30/6757* (2025.01); *H10B 43/27* (2023.02); *H10D 30/031* (2025.01);
(Continued)

(58) Field of Classification Search
CPC .......... H10D 30/6713; H10D 30/6757; H10D 62/882; H10D 30/47; H10D 64/035; H10B 43/27
See application file for complete search history.

(56) References Cited

U.S. PATENT DOCUMENTS 9,577,049 B1 * 2/2017 Lin .................. H01L 29/41733
2011/0309876 A1 * 12/2011 Terai ................. H01L 29/78648
257/E21.414

(Continued)

OTHER PUBLICATIONS

Himadri Pandey et al., "All CVD Boron Nitride Encapsulated Graphene FETs With CMOS Compatible Metal Edge Contacts", IEEE Transactions on Electron Devices, vol. 65, No. 10, Oct. 2018, pp. 4129-4134.
Meng-Yu Lin et al., "Toward epitaxially grown two-dimensional crystal hetero-structures: Single and double MoS2/graphene hetero-structures by chemical vapor depositions", Applied Physics Letters, vol. 105, 073501, Aug. 2014.
(Continued)

*Primary Examiner* — Khiem D Nguyen
(74) *Attorney, Agent, or Firm* — Maschoff Brennan

(57) ABSTRACT

A semiconductor device includes a substrate, a 2-D material channel layer, a 2-D material passivation layer, source/drain contacts, and a gate structure. The 2-D material channel layer is over the substrate, wherein the 2-D material channel layer is made of graphene. The 2-D material passivation layer is over the 2-D material channel layer, wherein the 2-D material passivation layer is made of transition metal dichalcogenide (TMD). The source/drain contacts are over the 2-D material passivation layer. The gate structure is over the 2-D material passivation layer and between the source/drain contacts.

20 Claims, 24 Drawing Sheets

(51) Int. Cl.
*H10D 30/01* (2025.01)
*H10D 62/80* (2025.01)

(52) U.S. Cl.
CPC ..... *H10D 30/6713* (2025.01); *H10D 30/6729* (2025.01); *H10D 62/882* (2025.01)

(56) References Cited

U.S. PATENT DOCUMENTS

| | | | | |
|---|---|---|---|---|
| 2012/0292677 | A1* | 11/2012 | Dubourdieu | H10D 30/87 257/295 |
| 2014/0374815 | A1* | 12/2014 | Wu | H01L 21/30604 257/326 |
| 2017/0345944 | A1* | 11/2017 | Lin | H10D 30/6741 |
| 2018/0114839 | A1* | 4/2018 | Wu | B82Y 10/00 |
| 2020/0357927 | A1* | 11/2020 | Hsieh | H10D 30/0415 |
| 2021/0057524 | A1* | 2/2021 | Lin | H10D 99/00 |

OTHER PUBLICATIONS

Hsuan-An Chen et al., "Scalable MoS2/graphene hetero-structures grown epitaxially on sapphire substrates for phototransistor applications", Semiconductor Science and Technology, vol. 33, No. 2, 025007, Jan. 2018.

Po-Cheng Tsai et al., "Luminescence Enhancement and Dual-Color Emission of Stacked Mono-layer 2D Materials", Nanotechnology, vol. 31, 365702, Jun. 2020.

Kuan-Chao Chen et al., "The atomic layer etching of molybdenum disulfides using low-power oxygen plasma", Semiconductor Science and Technology, vol. 34, 045007, Mar. 2019.

Yu-Wei Zhang et al., "Tungsten Diselenide Top-gate Transistors with Multilayer Antimonene Electrodes: Gate Stacks and Epitaxially Grown 2D Material Heterostructures", Scientific Reports, vol. 10, 5967, 2020.

* cited by examiner

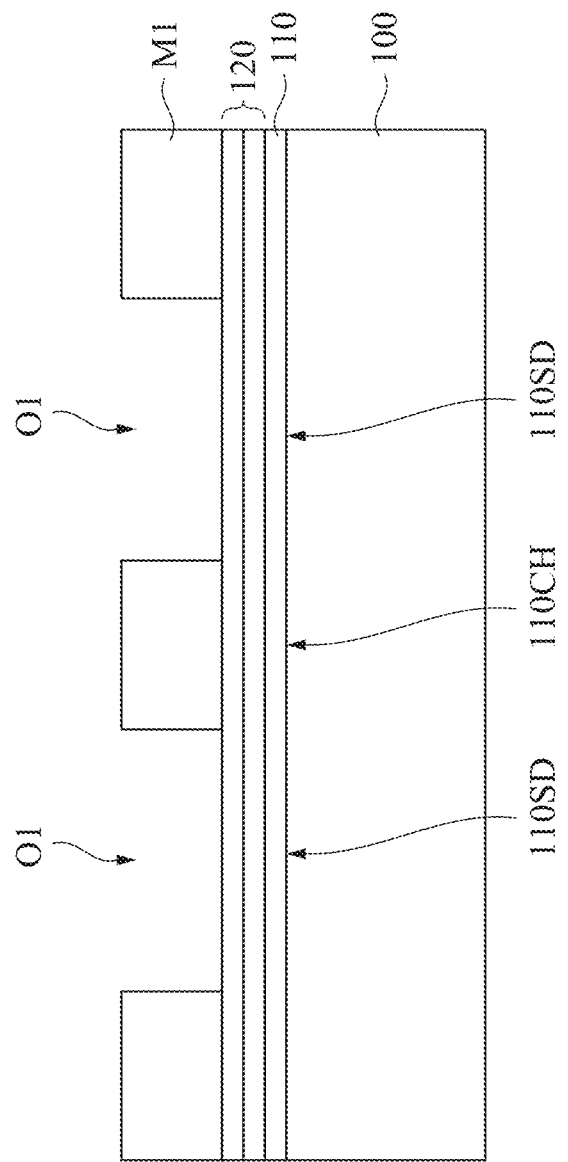

METHOD FOR FORMING A SEMICONDUCTOR DEVICE HAVING A 2-D MATERIAL CHANNEL OVER A SUBSTRATE

PRIORITY CLAIM AND CROSS-REFERENCE

The present application claims priority to U.S. Provisional Application Ser. No. 63/245,471, filed Sep. 17, 2021, which is herein incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9-15 illustrate a method in various stages of fabricating a semiconductor device in accordance with some embodiments of the present disclosure.

DETAILED DESCRIPTION

Figure 1A:
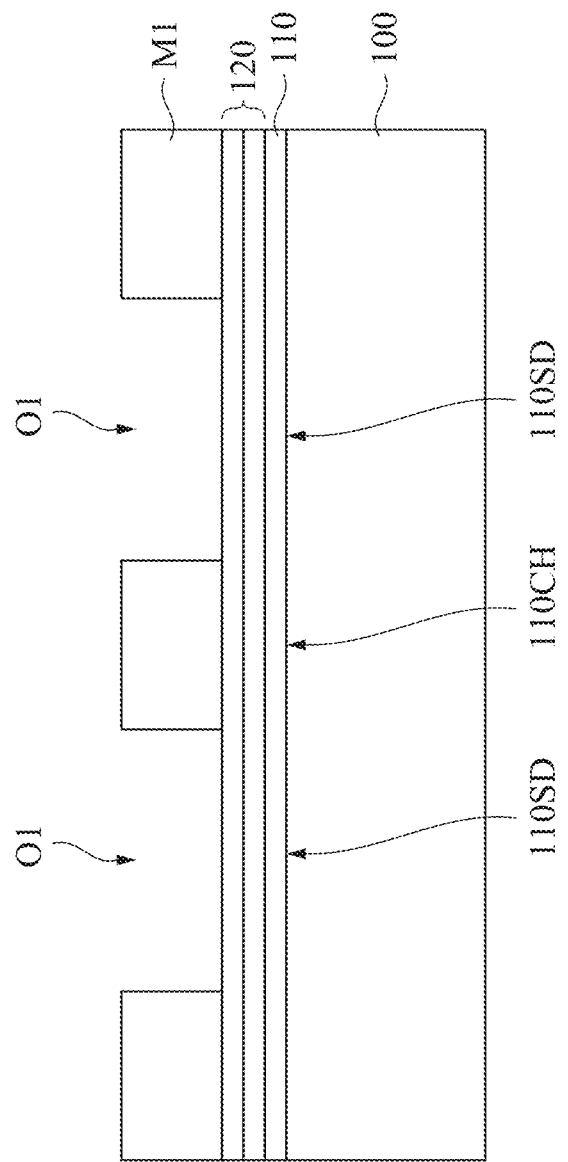
FIGS. 1A, 2, 3, 4, and 5 illustrate a method in various stages of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The major advantage of two-dimensional (2-D) materials for device applications is the demonstration of their unique characteristics such as high carrier mobility and bright luminescence in a few atomic layers. For example, devices with ultra-thin bodies can be easily fabricated by using 2-D materials, which made them a promising candidate for advanced electronics with reduced line widths. However, the same thin body characteristic will also hinder the practical device application of 2-D materials. With the ultra-thin active region down to a few nanometers, there is no bulk region for 2-D material channels. Since top-gate is the most common device architecture adopted for field-effect transistors (FETs) in industry, a poor dielectrics/2-D material interface may significantly degrade the device performances of 2-D material transistors.

On the other hand, one major difference between 2-D materials and traditional semiconductors such as Si or GaAs is that there is no chemical bond between 2-D material layers. As a result, the carrier transport in between the 2-D material layers may not be as easy as transitional semiconductors. With the demonstration of graphene growth directly on a sapphire substrate and following a molybdenum disulfide (MoS2) growth on the graphene surface, the heterostructure of semiconductor 2-D material ($MoS_2$) with conductive 2-D material (graphene) may open up a room for the establishment of charge storage layers and high-mobility channels in a few atomic layers. To demonstrate this possibility on epitaxially grown $MoS_2$/graphene hetero-structures, there are two requests for device fabrications. The first one is the non-destructive growth of the upper $MoS_2$ layer on the underlying graphene channel layer.

By using sulfurization of pre-deposited transition metal films, large-area transition metal dichalcogenides (TMDs) can be grown on different substrate surfaces such as sapphire, $Al_2O_3$, the other TMDs and graphene. Although different 2-D material hetero-structures can be established by using this technique, the Ar plasma introduced during the metal deposition procedure may bring additional damages to the underlying 2-D materials. Alternate approaches such as e-beam or thermal evaporations should be adopted for the depositions of either transition metals or transition metal oxides to avoid the damage to the underlying 2-D materials.

In some embodiments, scalable graphene films can be grown directly on sapphire substrates without the assistance of metal templates. Layer-number-controllable $MoS_2$ films can also be grown on the graphene surfaces by sulfurizing the pre-deposited Mo films prepared by the RF sputtering. However, damages to the underlying graphene films may be introduced due to the Ar plasma used in the RF sputtering system.

Inspired by the successful demonstrations of 2-D materials grown on 2-D material surface, embodiments of the present disclosure further provides a method about growing a 2-D material layer another 2-D material surface through the van der Waals epitaxy without damaging the 2-D material surface, as described in greater detail below.

FIGS. 1A to 5 illustrate a method in various stages of fabricating a semiconductor device in accordance with some embodiments of the present disclosure.

Reference is made to FIG. 1A. Shown there is a substrate 100. In some embodiments, the substrate 100 may function to provide mechanical and/or structure support for features or structures that are formed in the subsequent steps. These features or structures may be parts or portions of a semiconductor device (e.g. a transistor or a memory device) that may be formed on or over the substrate 100.

Generally, the substrate 100 illustrated in FIG. 1A may include a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally include the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates. In some other embodiments, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha$-$Al_2O_3$. Other elementary semiconductors like germanium may also be used for substrate 100.

A 2-D material layer 110 is formed over the substrate 100, and a 2-D material layer 120 is formed over the 2-D material layer 110. In some embodiments, the 2-D material layer 110 is in direct contact with the top surface of the substrate 100. As used herein, consistent with the accepted definition within solid state material art, a "2-D material" may refer to a crystalline material consisting of a single layer of atoms.

As widely accepted in the art, "2-D material" may also be referred to as a "mono-layer" material. In this disclosure, "2-D material" and "mono-layer" material are used interchangeably without differentiation in meanings, unless specifically pointed out otherwise. The 2-D material layer 110 may be 2-D materials of suitable thickness. In some embodiments, a 2-D material includes a single layer of atoms in each of its mono-layer structure, so the thickness of the 2-D material refers to a number of mono-layers of the 2-D material, which can be one mono-layer or more than one mono-layer. The coupling between two adjacent mono-layers of 2-D material includes van der Waals forces, which are weaker than the chemical bonds between/among atoms within the single mono-layer.

In some embodiments, the 2-D material layer 110 and the 2-D material layer 120 may be 2-D semiconductor materials, which are usually few-layer thick and exist as stacks of strongly bonded layers with weak interlayer van der Waals attraction, allowing the layers to be mechanically or chemically exfoliated into individual, atomically thin layers. The 2-D semiconductor materials are promising candidates of the channel, source, drain materials of transistors. Examples of 2-D semiconductor materials include transition metal dichalcogenides (TMDs), graphene, layered III-VI chalcogenide, graphene, hexagonal Boron Nitride (h-BN), black phosphorus or the like. The 2-D semiconductor may include one or more layers and can have a thickness within the range of about 0.5-100 nm in some embodiments. One advantageous feature of the few-layered 2D semiconductor is the high electron mobility value.

The 2-D material layer 110 and the 2-D material layer 120 are made of different 2-D materials. In some embodiments, the 2-D material layer 120 may include less conductivity than the 2-D material layer 110. For example, the 2-D material layer 110 is made of graphene, and the 2-D material layer 120 is made of transition metal dichalcogenides (TMDs). Because of the conductivity difference, the 2-D material layer 110 can serve as a channel layer of a transistor, and the 2-D material layer 120 can serve as a passivation layer of the transistor.

Figure 1C:
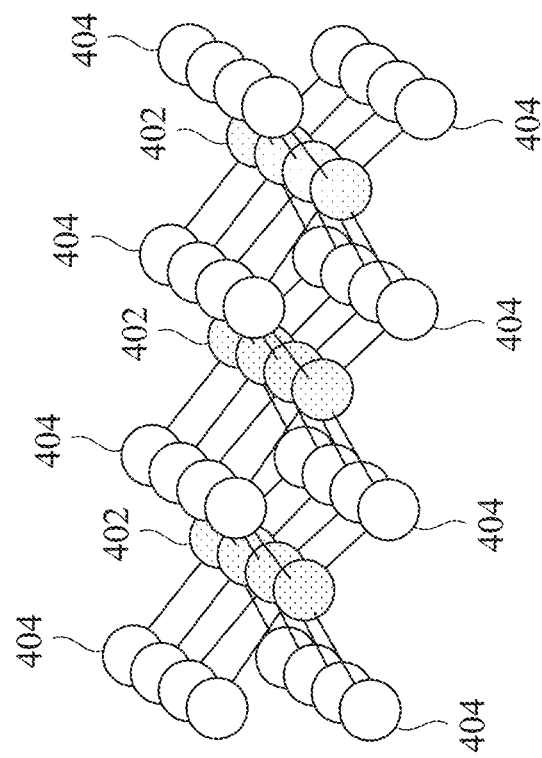
FIG. 1C illustrates a molecular diagram of transition metal dichalcogenide compound in accordance with some embodiments of the present disclosure.
Figure 1B:
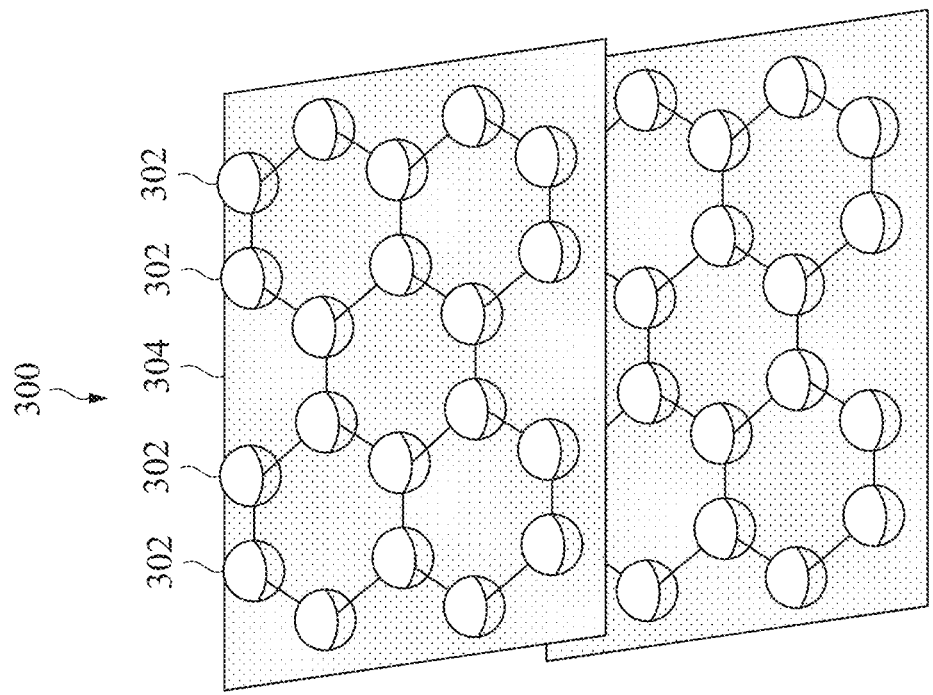
FIG. 1B illustrates a molecular diagram of graphene in accordance with some embodiments of the present disclosure.

FIG. 1B illustrates a molecular diagram 300 of graphene (e.g., the 2-D material layer 110) according to some embodiments of the present disclosure. Graphene is an arrangement of carbon atoms 302 in mono-layers aligned along a single plane 304. As pure graphene has a high conductivity, it may be doped with one or more impurities to control mobility and induce a semiconductor-like response to a gate voltage. In various embodiments, the graphene is doped with titanium, chromium, iron, $NH_3$, potassium, and/or $NO_2$.

FIG. 1C illustrates a molecular diagram 400 of a transition metal dichalcogenide compound (e.g., the 2-D material layer 110) according to some embodiments of the present disclosure. The one-molecule thick TMD material layer includes atoms 402 of a transition metal and atoms 404 of a chalcogenide. The transition metal atoms 402 may form a layer in a middle region of the one-molecule thick TMD material layer, and the chalcogen atoms 404 may form a first layer over the middle layer of transition metal atoms 402, and a second layer underlying the middle layer of transition metal atoms 402. The transition metal atoms 402 may be W atoms or Mo atoms, while the chalcogen atoms 404 may be S atoms, Se atoms, or Te atoms. Throughout the description, the illustrated cross-bonded layers including one layer of transition metal atoms 402 and two layers of chalcogen atoms 404 in combination are referred to as a mono-layer of TMD. Similar to graphene, transition metal dichalcogenide materials align in generally planar mono-layers. Also similar to graphene, transition metal dichalcogenide materials exhibit high conductivity and carrier mobility.

In some embodiments where the 2-D material layer 110 is made of graphene, the graphene layer may be formed by epitaxial graphene growth. In some embodiments, a silicon carbide dielectric is used as a seed layer to promote the epitaxial growth of the graphene on the substrate 100. In some embodiments, another exemplary technique for forming a graphene layer utilizes CVD (chemical vapor deposition) directly on the substrate 100. In some other embodiments, graphene layer may be formed on a backing material (such as an adhesive tape), the backing material can be adhered to the substrate 100. Then, the backing material can be removed while leaving the graphene layer on the substrate 100. In some other embodiments, graphene is formed by reacting a metal film with silicon carbide to form a metal carbide. The metal carbide is annealed to produce a metal silicide and graphene from the remaining carbon. In yet other exemplary embodiments, graphene layer is deposited using an aqueous solution of graphene oxide. Aside from graphene, other more conductive 2-D materials such as silicene, germanene and stanene may also be used as the material of the 2-D material layer 110.

To control mobility and to produce a semiconductor-like response to a gate voltage, the 2-D material layer 110 of the sheet layer may be doped by adding impurities. In some embodiments dopants such as boron (B) and nitrogen (N) are substituted for carbon atoms in the graphene matrix (atomic substitution). Additionally or in the alternative, the regular structure of the graphene may be disrupted by adding dopants such as titanium, chromium, iron, $NH_3$, potassium, and $NO_2$ in order to produce a desired bandgap.

In some embodiment where the 2-D material layer 120 is made of TMD mono-layers, the TMD mono-layers include molybdenum disulfide ($MoS_2$), tungsten disulfide ($WS_2$), tungsten diselenide ($WSe_2$), or the like. In some embodiments, $MoS_2$ and $WS_2$ may be formed on the 2-D material layer 110, using suitable approaches. For example, $MoS_2$ and $WS_2$ may be formed by micromechanical exfoliation and coupled over the substrate 2-D material layer 110, or by sulfurization of a pre-deposited molybdenum (Mo) film or tungsten (W) film over the 2-D material layer 110. In alternative embodiments, $WSe_2$ may be formed by micromechanical exfoliation and coupled over the 2-D material layer 110, or by selenization of a pre-deposited tungsten (W) film over the 2-D material layer 110 using thermally cracked Se molecules. The growth temperatures for TMDs such as $MoS_2$ can be much lower than h-BN (a 2D insulator). It is possible to further reduce the growth temperature of TMDs to lower than about 400° C.

In some other embodiments where $MoS_2$ is formed by micromechanical exfoliation, the 2-D material layer 120 is formed on another substrate and then transferred to the 2-D material layer 110. For example, a 2-D material film is formed on a first substrate by chemical vapor deposition (CVD), sputtering or atomic layer deposition in some embodiments. A polymer film, such as poly(methyl methacrylate) (PMMA), is subsequently formed on the 2-D material film. After forming the polymer film, the sample is heated, such as by placing the sample on a hot plate. Subsequent to heating, a corner of the 2-D material film is peeled off the first substrate, such as by using a tweezers, and the sample is submerged in a solution to facilitate the separation of the 2-D material film from the first substrate. The 2-D material film and polymer film are transferred to the 2-D material layer 110. The polymer film is then removed from the 2-D material film using a suitable solvent.

In some embodiments, the 2-D material layer 120 may be formed by suitable deposition process without using plasma treatment. For example, the deposition process using plasma treatment may include RF sputtering, which may cause damage to the underlying 2-D material layer 110. In some embodiments, the 2-D material layer 120 may be formed by thermal evaporation. For example, a $MoO_3$ layer is deposited over the 2-D material layer 110, and then performing a sulfurization process to the $MoO_3$ film using the thermal evaporator. In some embodiments, similar growth techniques without using plasma treatment, such as molecular beam epitaxy (MBE), atomic layer deposition (ALD) and e-gun evaporation, may also be adopted for the deposition of the 2-D material layer 120.

In some embodiments, forming of the 2-D material layer 120 also includes treating the 2-D material layer 120 to obtain expected electronic properties of the 2-D material layer 120. The treating processes include thinning (namely, reducing the thickness of the 2-D material layer 120), doping, or straining, to make the 2-D material layer 120 exhibit certain semiconductor properties, e.g., including direct bandgap.

In some embodiments, the 2-D material layer 110 may act as a channel layer, in which the 2-D material layer 110 may include a channel region 110CH and source/drain regions 110SD on opposite sides of the channel region 110CH. In some embodiments, the 2-D material layer 120 may act as a passivation layer between the 2-D material layer 110 and a gate dielectric layer of a gate structure (e.g., the gate dielectric layer 140 of the gate structure 160 of FIG. 5).

In some embodiments, the 2-D material layer 110 may be omitted. Besides conductive 2D materials, traditional semiconductors such as Si and GaAs may also act as the channel layer for the device.

A patterned mask M1 is formed over the 2-D material layer 120. The patterned mask M1 may include openings O1 that substantially align with the source/drain regions 110SD of the 2-D material layer 110. In some embodiments, the patterned mask M1 may be a photoresist, a hard mask, or suitable materials, and may be patterned using a photolithography technique.

In some embodiments, an ion implantation process may be performed, through the openings O1 of the patterned mask M1, to form doped regions in source/drain regions 110SD of the 2-D material layer 110. These doped regions may be formed, for example, by implanting n-type or p-type dopants (e.g., As, P, B, In, or the like) into source/drain regions 110SD of the 2-D material layer 110 by using an ion implantation process, except for channel region 110CH of the 2-D material layer 110 directly below a gate structure (e.g., the gate structure 160 of FIG. 5); or by first depositing a dopant source layer over source/drain regions of the 2-D material layer 110 and then diffusing dopants from the dopant source layer into the 2-D material layer 110 by annealing.

Figure 2:
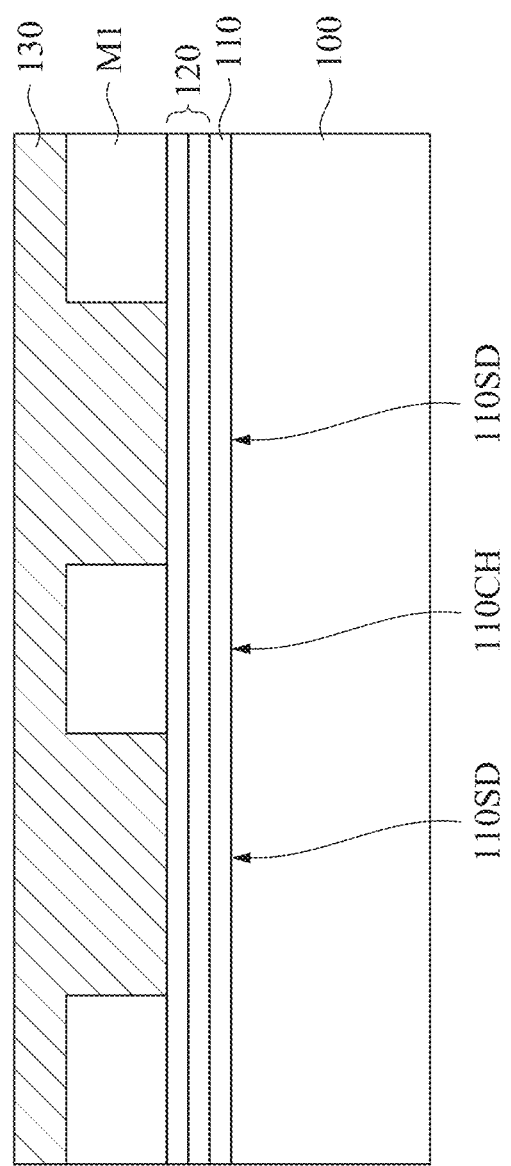

Reference is made to FIG. 2. A metal layer 130 is deposited over the patterned mask M1 and overfilling the openings O1 of the patterned mask M1. In some embodiments, the metal layer 130 may include conductive material, such as indium (In), plumbum (Pb), copper (Cu), silver (Ag), gold (Au), nickel (Ni), platinum (Pt), cobalt (Co), rhodium (Rh), ferrum (Fe), ruthenium (Ru), manganese (Mn), molybdenum (Mo), Vanadium (V), titanium (Ti), zirconium (Zr), hafnium (Hf), Magnesium (Mg), or the like. In some other embodiments, the metal layer 130 may be a multi-layer structure. For example, the metal layer 130 may include a first layer made of a first metal, and a second layer made of a second metal over the first layer, in which the first metal and the second metal are made of different materials. For example, first metal may be titanium (Ti) having a thickness in a range from about 9 nm to about 11 nm (e.g., 10 nm), and the second metal may be gold (Au) having a thickness in a range from about 90 nm to about 110 nm (e.g., 100 nm). In some embodiments, the metal layer 130 may be formed by acceptable deposition technique, such as e-beam, CVD, ALD, PEALD, PECVD, PVD, ECP, electroless plating, or the like, or any combination thereof.

Figure 3:
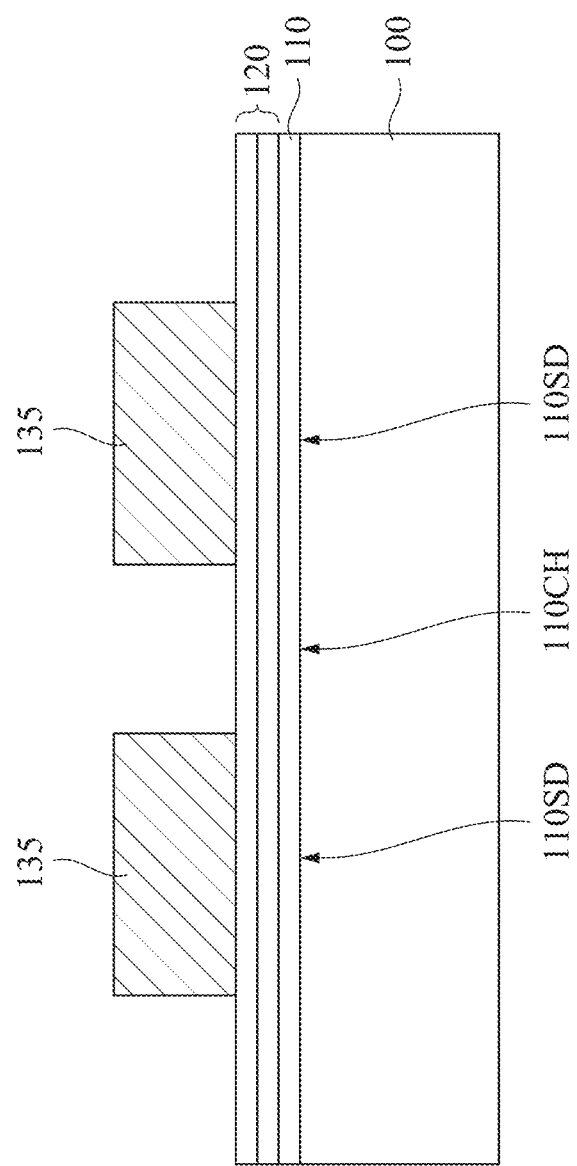

Reference is made to FIG. 3. The patterned mask M1 may be removed, while leaving portions of the metal layer 130 (see FIG. 2) remaining over the 2-D material layer 120 and covering the source/drain regions 110SD of the 2-D material layer 110. In some embodiments, the remaining portions of the metal layer 130 are substantially align with the source/drain regions 110SD of the 2-D material layer 110, respectively, and the remaining portions of the metal layer 130 may be referred as source/drain contacts 135.

In some embodiments, the patterned mask M1 may be removed by lifting off the patterned mask M1 together with portions of the metal layer 130 over the top surface of the patterned mask M1. In some other embodiments, a chemical mechanism polishing (CMP) may be performed to remove excess material of the metal layer 130 until top surface of the patterned mask M1 is exposed, and then removing the patterned mask M1 by suitable process, such as ashing.

Figure 4:
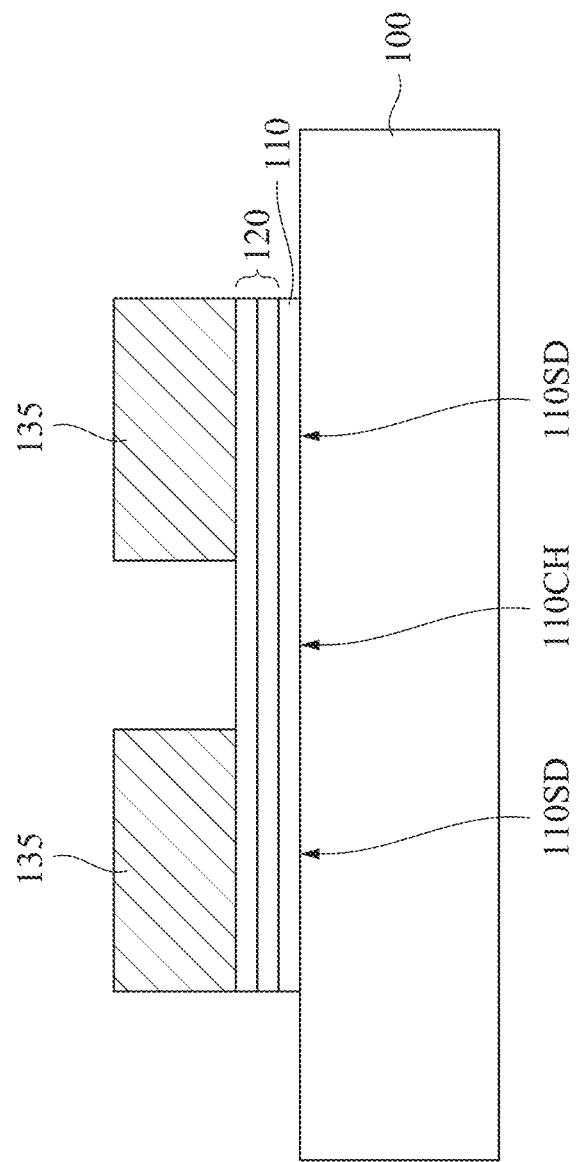

Reference is made to FIG. 4. The 2-D material layer 110 and the 2-D material layer 120 are patterned to define an active layer of the 2-D material layer 110. In greater details, portions of the 2-D material layer 110 other than the channel region 110CH and the source/drain regions 110SD are removed during the patterning process. For example, portions of the 2-D material layers 110 and 120 under the source/drain contacts 135 and portions of the 2-D material layer 110 and 120 between the source/drain contacts 135 are protected during the patterning process and remain over the substrate 100 after the patterning process.

In some embodiments, the 2-D material layer 110 and the 2-D material layer 120 may be patterned by, for example, depositing a patterned mask (not shown) that exposes unwanted portions of the 2-D material layer 110 and the 2-D material layer 120, performing an etching process to remove the unwanted portions of the 2-D material layer 110 and the 2-D material layer 120, and then removing the patterned mask.

Figure 5:
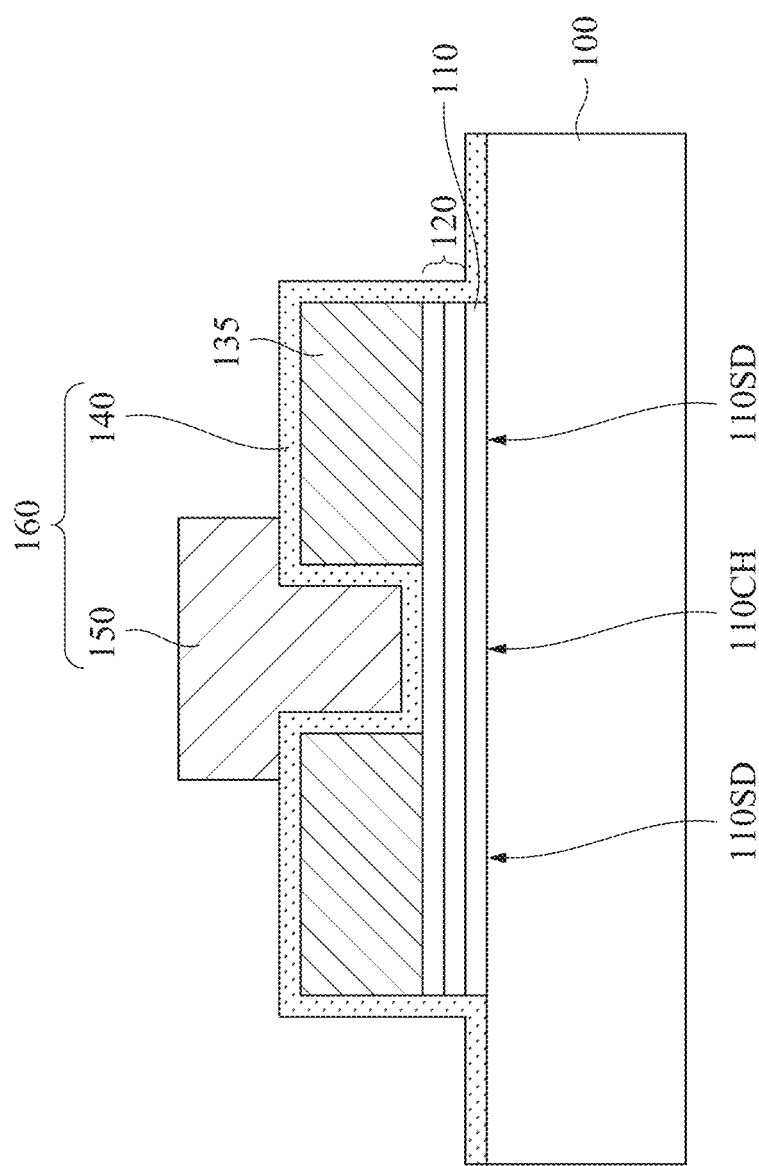

Reference is made to FIG. 5. A gate dielectric layer 140 is formed over the substrate 100, and a gate electrode 150 is formed over the gate dielectric layer 140. In greater details, the gate dielectric layer 140 is formed in contact with the 2-D material layer 120 and covering the channel region 110CH of the 2-D material layer 110. Moreover, the gate dielectric layer 140 is formed lining opposite sidewalls of each source/drain contact 135, lining opposite sidewalls of the 2-D material layer 110 and opposite sidewalls of the 2-D material layer 120, and further extending to exposed surface of the substrate 100. The gate electrode 150 is formed covering the channel region 110CH of the 2-D material layer 110, and further extending to positions vertically above the top surfaces of the source/drain contacts 135. The gate dielectric layer 140 and the gate electrode 150 may be collectively referred to as a gate structure 160. In some embodiments, the 2-D material layer 110, the 2-D material layer 120, the gate structure 160, and the source/drain contacts 135 may collectively serve as a transistor.

The gate dielectric layer 140 includes silicon oxide, silicon oxynitride, a combination thereof, or another suitable material. In some embodiments, the gate dielectric layer 140 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 140 is formed using a chemical vapor deposition process or another suitable process. In some embodiments where the gate dielectric layer 140 is made of aluminum oxide ($Al_2O_3$), the gate dielectric layer 140 made be formed by depositing a 5 nm thin $Al_2O_3$ film by e-beam deposition, and then depositing a 25 nm $Al_2O_3$ film by ALD process.

The gate electrode 150 can be formed of suitable electrically conductive material, including polysilicon and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The gate electrode 150 may be formed by one or more deposition processes, such as chemical vapor deposition (CVD), atomic layer deposition (ALD), physical vapor deposition (PVD) (sputtering), electroplating, and/or other suitable method, followed by one or more etching process to pattern the deposited materials of gate electrode 150. In some other embodiments, the gate electrode 150 may be a multi-layer structure. For example, the gate electrode 150 may include a first layer made of a first metal, and a second layer made of a second metal over the first layer, in which the first metal and the second metal are made of different materials. For example, first metal may be titanium (Ti) having a thickness in a range from about 9 nm to about 11 nm (e.g., 10 nm), and the second metal may be gold (Au) having a thickness in a range from about 90 nm to about 110 nm (e.g., 100 nm).

In some embodiments of the present disclosure, a passivation 2-D material layer (e.g., the 2-D material layer 120) is formed between a channel 2-D material layer (e.g., the 2-D material layer 110) and a gate dielectric layer (e.g., the gate dielectric layer 140), the passivation 2-D material layer may act as a protective layer of the channel 2-D material layer, such that the channel 2-D material layer would not be damaged during forming the gate dielectric layer. Furthermore, the passivation 2-D material layer is formed by a deposition process without using plasma treatment, which will prevent damage to the underlying channel 2-D material layer. As a result, the device performance will be improved.

Figure 6A:
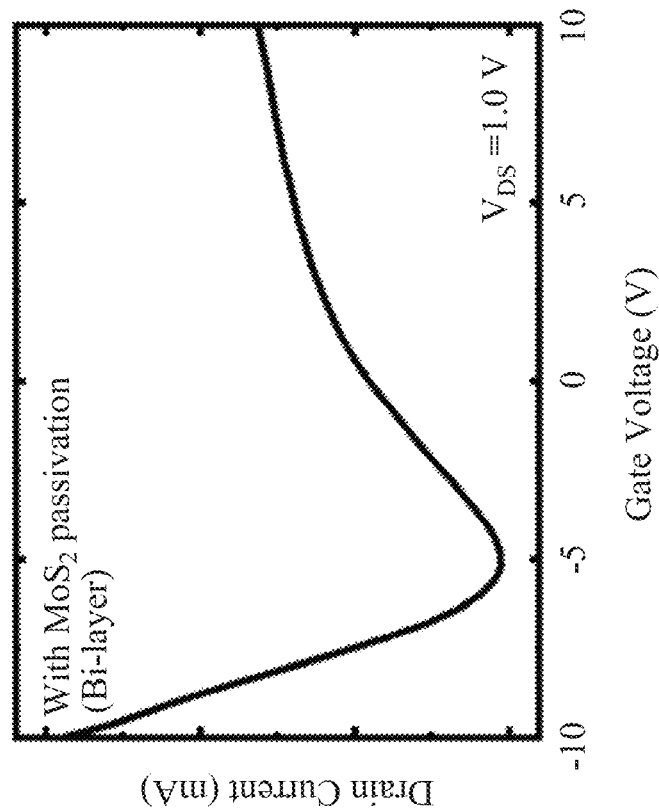
FIGS. 6A and 6B illustrate $I_D$-$V_{GS}$ curves of semiconductor devices in accordance with some embodiments of the present disclosure.
Figure 6B:
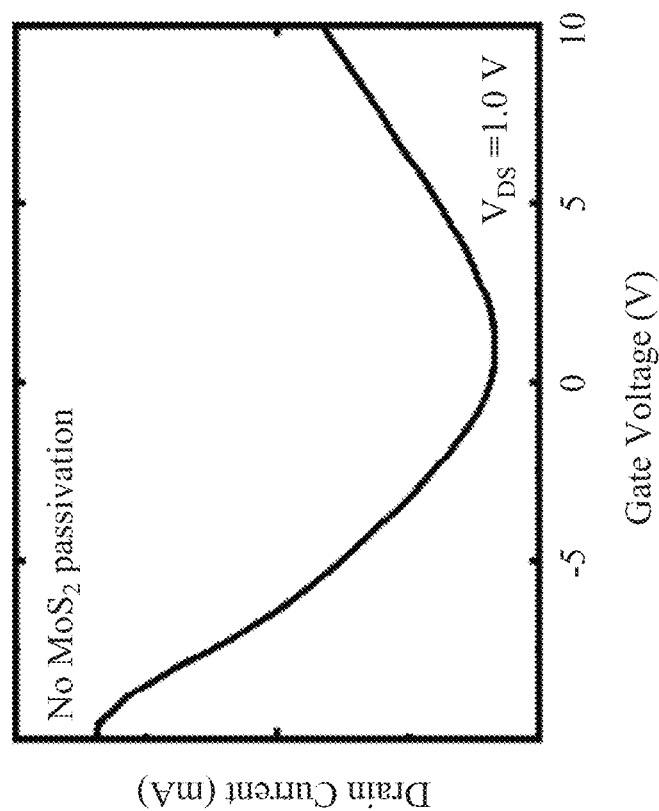

FIGS. 6A and 6B are $I_D$-$V_{GS}$ curves under different conditions. For example, FIG. 6A illustrates an $I_D$-$V_{GS}$ curve of the transistor of FIG. 5 when the second 2-D material 120 is omitted, such that the gate dielectric layer 140 may be in direct contact with the 2-D material layer 110. FIG. 6B illustrates an $I_D$-$V_{GS}$ curve of the transistor of FIG. 5 with the second 2-D material 120 having 2 mono-layers of $MoS_2$. In some embodiments, the $I_D$-$V_{GS}$ curves of the two devices with and without the $MoS_2$ passivation layers are measured at $V_{DS}$=1.0 V.

Comparing FIGS. 6A and 6B, it can be seen that the $I_D$-$V_{GS}$ characteristic are improved when second 2-D material 120 is inserted between the 2-D material layer 110 and the gate dielectric layer 140. Furthermore, the derived hole and electron mobility values of the device without the $MoS_2$ passivation layer are 9.3 and 3.8 $cm^2/V.s$, respectively. Compared with the device with no 2-D passivation layer, the derived hole and electron mobility values of the device with the bi-layer $MoS_2$ passivation layer are 35.0 and 8.2 $cm^2/V.s$, respectively. The results reveal that the gate dielectric layer (e.g., the gate dielectric layer 140) may adversely affect the thin 2-D channel layer with few atomic layers (e.g., the 2-D material layer 110). However, when a passivation 2-D material layer (e.g., the 2-D material layer 120) is formed between the gate dielectric layer and the 2-D channel layer, the device performance may be improved.

Figure 7B:
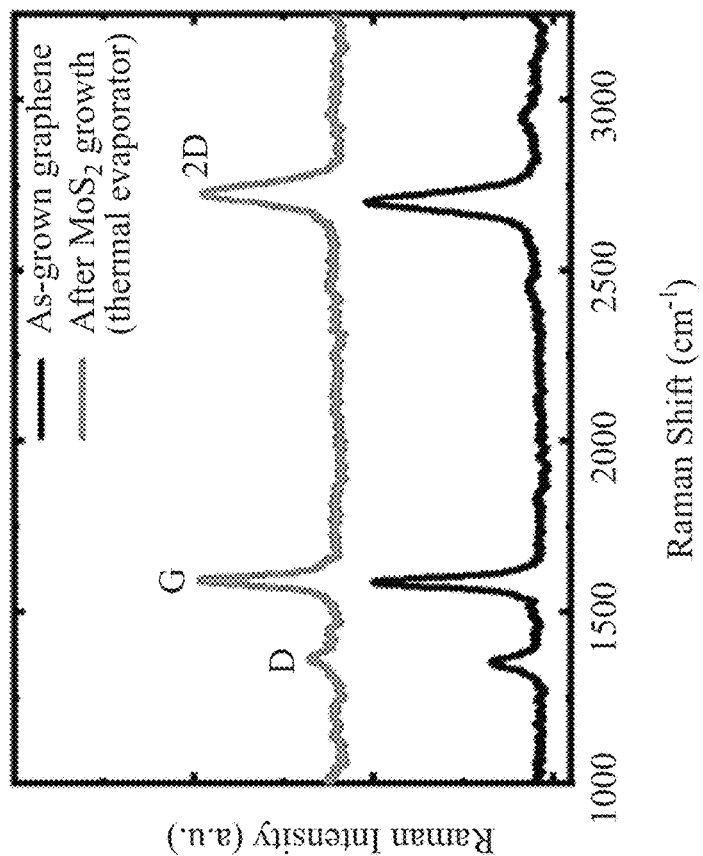
FIGS. 7A and 7B are Raman spectra in accordance with some embodiments of the present disclosure.
Figure 7A:
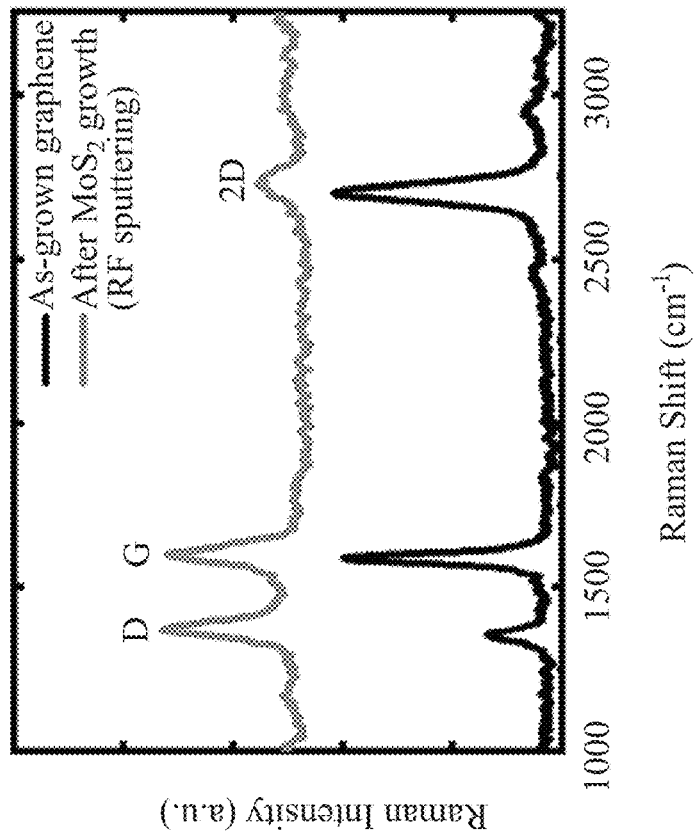

FIGS. 7A and 7B are Raman spectra under different conditions. For example, FIG. 7A illustrates Raman spectra of a graphene channel (e.g., the 2-D material layer 110) before and after a $MoS_2$ film (e.g., the 2-D material layer 120) is formed using RF sputtering. FIG. 7B illustrates Raman spectra of a graphene film (e.g., the 2-D material layer 110) before and after a $MoS_2$ film (e.g., the 2-D material layer 120) is formed using thermal evaporation (without plasma treatment).

As shown in FIG. 7A, after the $MoS_2$ film is growth, the D/G peak ratios increase from about 0.3 to about 1.0. The increasing D/G peak ratio may indicate that additional defects are introduced to the graphene channel after the $MoS_2$ growth procedure using RF sputtering (with plasma treatment). The Hall mobility values of the graphene film also reduce from about 274 to about 30 $cm^2/Vs$. Although the grown $MoS_2$ film may separate the graphene channel to the gate dielectric layer, the defects introduced to graphene channel the during the $MoS_2$ growth procedure using RF sputtering (with plasma treatment) would degrade the device performances.

On the other hand, as shown in FIG. 7B, similar D/G peak ratios (about 0.3) with the graphene channel are observed before and after the $MoS_2$ film is growth using thermal evaporation (without plasma treatment). Furthermore, similar Hall mobility value 280 $cm^2/Vs$ with the graphene channel is also observed for the $MoS_2$/graphene sample. With the similar D/G peak ratios and Hall mobility values before and after the $MoS_2$ growth, the results reveal that compared with RF sputtering, limited defects are introduced to the graphene channel during the $MoS_2$ growth procedure. Accordingly, the $MoS_2$ films formed by using the thermal evaporator may act as a passivation layer to the graphene channel.

Figure 8B:
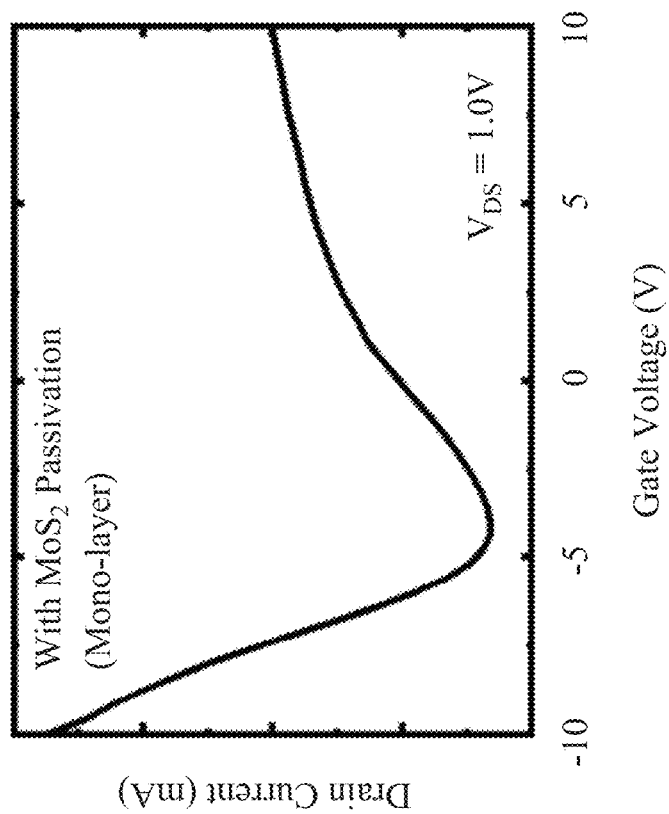
FIG. 8B illustrates an $I_D$-$V_{GS}$ curve of a semiconductor device in accordance with some embodiments of the present disclosure.
Figure 8A:
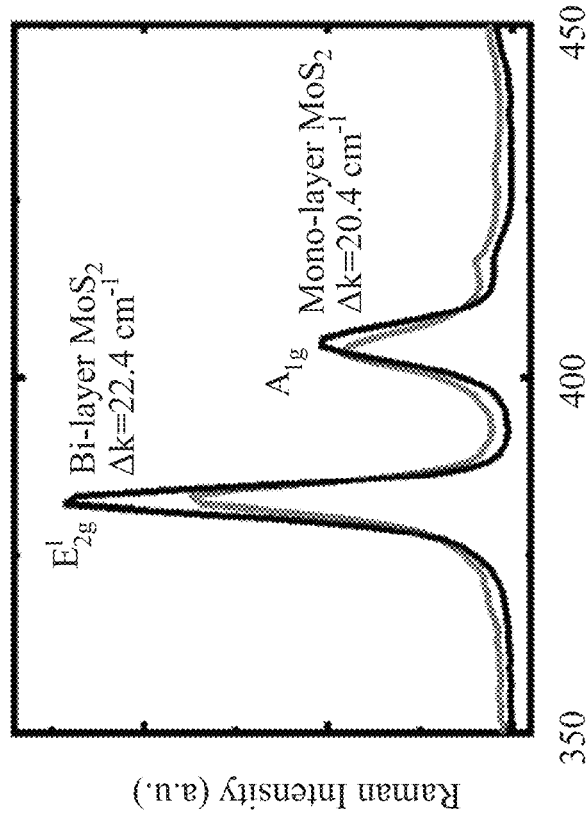
FIG. 8A is a Raman spectrum in accordance with some embodiments of the present disclosure.

FIG. 8A illustrates Raman spectra of samples with bi-layer and single mono-layer $MoS_2$ films grown on a graphene surface. FIG. 8B illustrates an $I_D$-$V_{GS}$ curve of the transistor of FIG. 5 with the second 2-D material 120 having single mono-layer of $MoS_2$.

Since the major advantage of 2-D materials for device applications is the thickness controllability down to single 2-D material mono-layer, a sample with single mono-layer $MoS_2$ grown on the graphene film is prepared. The Raman spectra of the samples with bi-layer and mono-layer $MoS_2$ films grown on graphene surfaces are shown in FIG. 8A. The two characteristics of Raman peaks $E^1_{2g}$ and $A_{1g}$ of $MoS_2$ are shown in FIG. 8A. As shown in FIG. 8A, the energy difference ($\Delta k$) between the two $MoS_2$ characteristic Raman peaks drops from 22.4 to 20.4 $cm^{-1}$. The slightly decreasing of $\Delta k$ suggests that a mono-layer $MoS_2$ may be obtained over a graphene film for the sample with $\Delta k$ value 20.4 cm* Following similar procedure, the sample with a mono-layer $MoS_2$ passivation layer is also fabricated into a top-gate transistor, the $I_D$-$V_{GS}$ curve of the device at VDS=1.0 V is shown in FIG. 8B. The derived hole and electron mobility values of the device are 30.0 and 9.5 $cm^2/Vs$, respectively, which are close to the value of the device with a bi-layer $MoS_2$ passivation layer. The results reveal that by using 2-D material as a passivation layer, thinnest thickness down to one 2-D material mono-layer can be achieved, which is advantageous for device shrinkage.

FIGS. 9 to 15 illustrate a method in various stages of fabricating a semiconductor device in accordance with some embodiments of the present disclosure. It is noted that some elements described in FIGS. 9 to 15 may be similar to those described in FIGS. 1A to 5, such elements are labeled the same, and relevant details will not be repeated for brevity.

Reference is made to FIG. 9. A 2-D material layer 110 is formed over a substrate 100, and a 2-D material layer 120 is formed over the 2-D material layer 110. In some embodiments, the 2-D material layer 110 and the 2-D material layer 120 may be formed of different 2-D materials. For example, the 2-D material layer 110 may be made of graphene, while the 2-D material layer 120 may be made of transition metal dichalcogenide (TMD). In some embodiments, the 2-D material layer 110 may act as a channel layer, in which the 2-D material layer 110 may include a channel region 110CH and source/drain regions 110SD on opposite sides of the channel region 110CH.

A patterned mask M1 is formed over the 2-D material layer 120. The patterned mask M1 may include openings O1 that substantially align with the source/drain regions 110SD of the 2-D material layer 110.

Figure 10A:
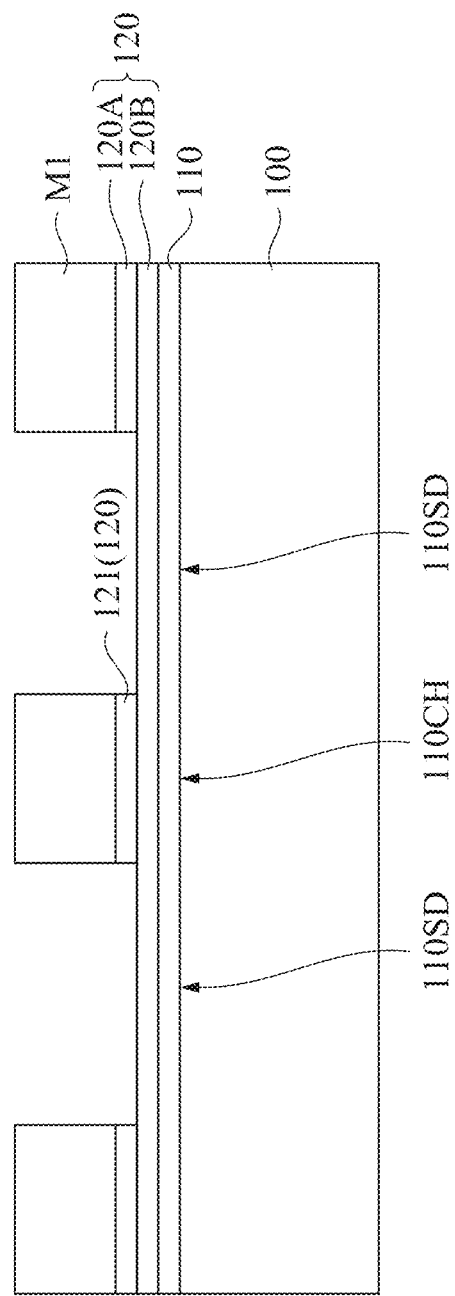
Figure 10B:
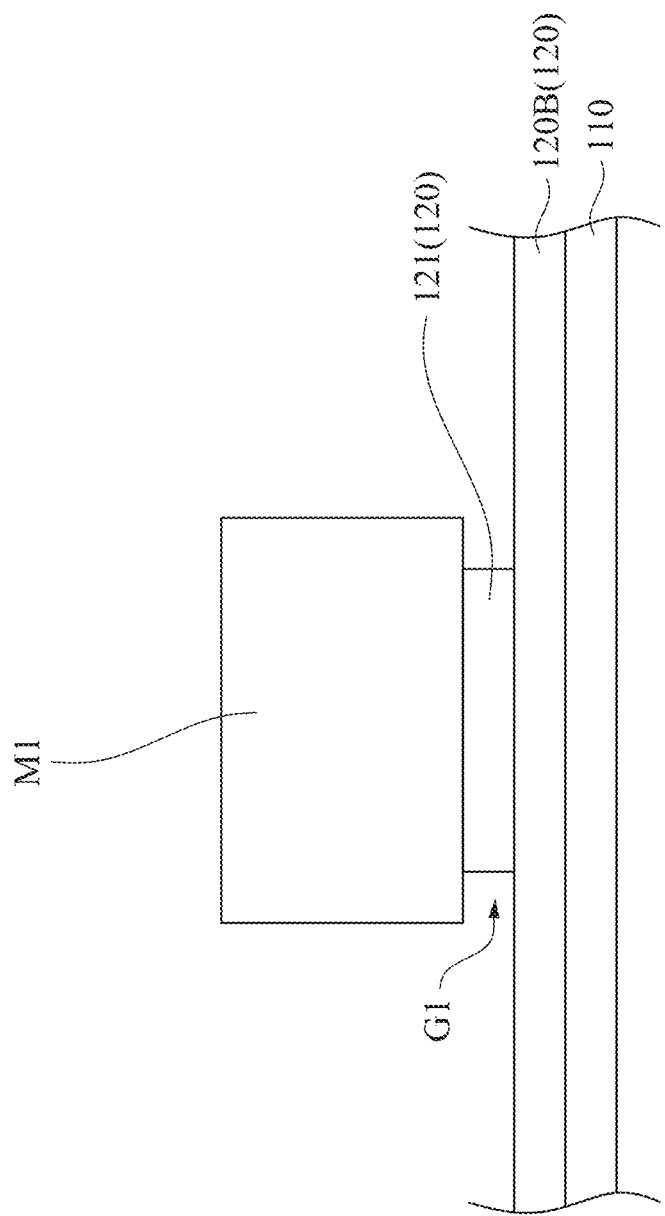

Reference is made to FIGS. 10A and 10B, in which FIG. 10B is an enlarged view of FIG. 10A. An etching process is performed to remove portions of the 2-D material layer 120 through the openings O1 of the patterned mask M1. The 2-D material layer 120 includes at least 2 mono-layers of 2-D material, and the etching process may etch at least one mono-layer of the 2-D material layer 120 from the top portion 120A of the 2-D material layer 120, while leaving at least one mono-layer of the 2-D material layer 120 at the bottom portion 120B of the 2-D material layer 120 substantially intact. Because the top portion 120A of the 2-D material layer 120 is etched during the etching process, the top portion 120A of the 2-D material layer 120 includes at least a remaining portion 121 substantially overlapping the channel region 110CH of the 2-D material layer 110. On the other hand, the bottom portion 120B of the 2-D material layer 120 can also be referred to as an un-etched portion of the 2-D material layer 120 during the etching process.

In some embodiments, the etching process may include an atomic layer etching (ALE) process. In some embodiments where the 2-D material layer 120 is made of $MoS_2$, the ALE process is a layered removal mechanism of $MoS_2$ using low-power oxygen plasma. Each ALE cycle includes a low-power oxygen plasma treatment, a dipping procedure, and a re-sulfurization procedure. During the low-power oxygen plasma treatment, the topmost $MoS_2$ mono-layer is oxidized. This will result in a weaker adhesion of Mo oxides with underlying $MoS_2$ surfaces, which may lead to detachment of the topmost oxidized $MoS_2$ layer from the underlying $MoS_2$ films. Afterward, the dipping procedure is performed to remove the topmost oxidized $MoS_2$ layer. Since $MoS_2$ is insoluble and Mo oxides are soluble in water, the dipping procedure of the sample in de-ionized water will help with the complete detachment of the topmost oxidized $MoS_2$ layer. Afterwards, with a re-sulfurization procedure after the removal of topmost oxidized $MoS_2$ layer, the partially oxidized $MoS_2$ film remaining on the substrate can be recovered back to a complete $MoS_2$ film. Both optical and electrical characteristics of the $MoS_2$ films can be maintained after the removal procedure. By repeating the ALE cycle, a layer-by-layer removal of $MoS_2$ can be achieved.

In some embodiments, each ALE cycle may remove one mono-layer of the 2-D material layer 120. Because at least one mono-layer of the bottom portion 120B of the 2-D material layer 120 is un-etched, the number of ALE cycles may be less than the total number of the mono-layers of the 2-D material layer 120. For example, if the 2-D material layer 120 has n mono-layers, the ALE cycles of the etching process should be less than n times, namely at most (n−1) times. This will ensure that at least one mono-layer of the 2-D material layer 120 remains intact during the etching process. The un-etched portion 120B of the 2-D material layer 120 may serve as a protective layer of the underlying 2-D material layer 110.

In some embodiments, the etching process may etch only one mono-layer of the 2-D material layer 120 from the top portion 120A of the 2-D material layer 120. That is, only one ALE cycle is performed during the etching process. As a result, the remaining portion 121 of the top portion 120A of the 2-D material layer 120 may include only one mono-layer of 2-D material. In some other embodiments, about 1-10 ALE cycle(s) are performed during the etching process. Accordingly, the remaining portion 121 of the top portion 120A of the 2-D material layer 120 may include one or more mono-layers of 2-D material, such as about 1-10 mono-layers of 2-D material.

Reference is made to FIG. 10B, in which FIG. 10B is an enlarged view of FIG. 10A. During the etching process, portions of the 2-D material layer 120 are protected by the patterned mask M1. This results in that the portion 121 of the 2-D material layer 120 remains under the patterned mask M1 after the etching process. However, although the patterned mask M1 protects the underlying 2-D material layer 120, the etching process may slightly over etch the portion 121 of the 2-D material layer 120 protected by the patterned mask M1 through the openings O1 of the patterned mask M1. Accordingly, gaps G1 may be formed under the patterned mask M1 and on opposite sides of the remaining portion 121 of the 2-D material layer 120.

Figure 11A:
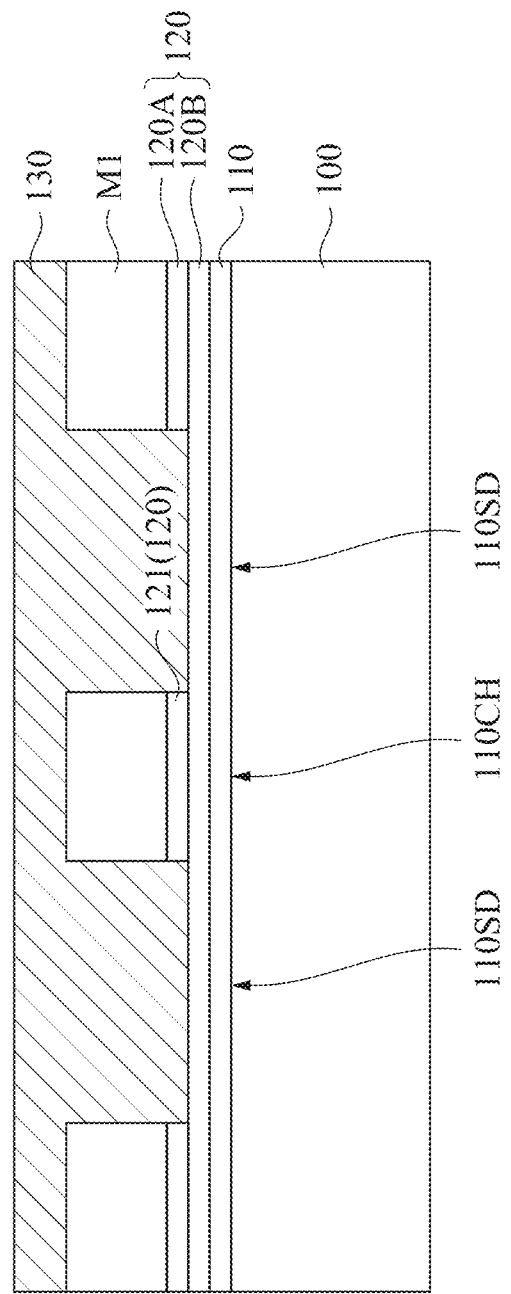
Figure 11B:
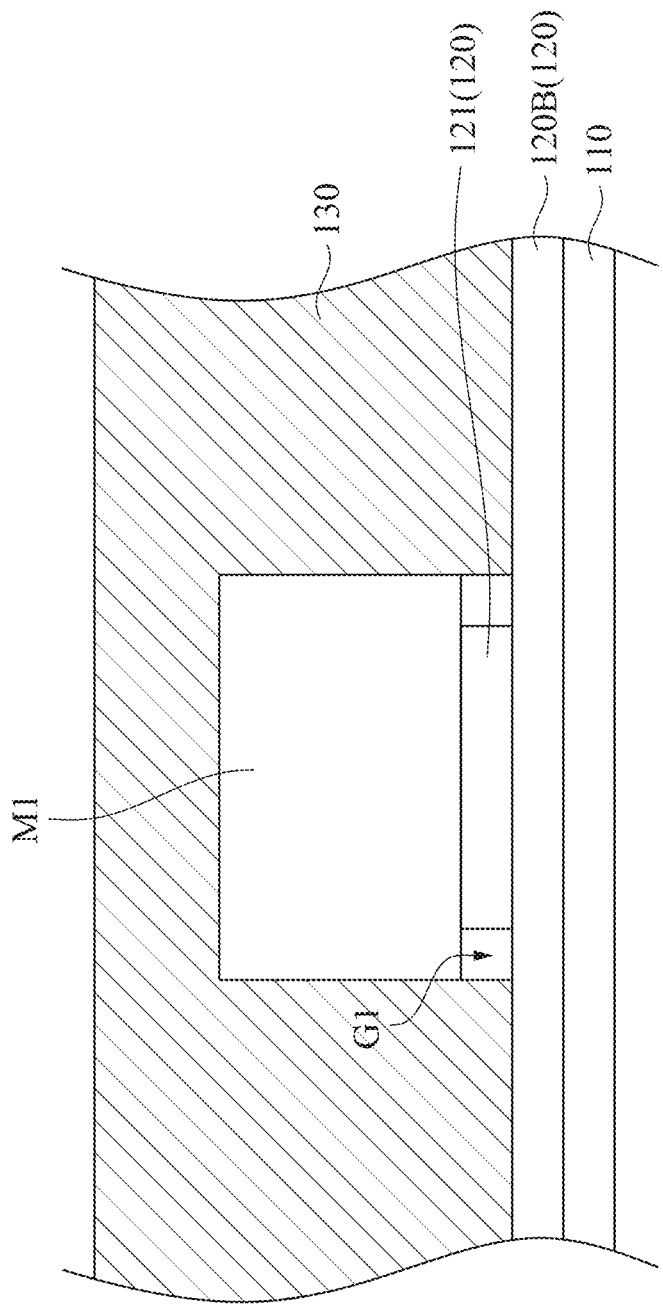

Reference is made to FIGS. 11A and 11B, in which FIG. 11B is an enlarged view of FIG. 11A. A metal layer 130 is deposited over the patterned mask M1 and overfilling the openings O1 of the patterned mask M1. In some embodiments, the metal layer 130 is in contact with the bottom portion 120B of the 2-D material layer 120. Accordingly, the bottommost surface of the metal layer 130 is lower than the top surface of the portion 121 of the 2-D material layer 120 and the bottom surface of the patterned mask M1.

In some embodiments, the metal layer 130 may include a first layer made of a first metal, and a second layer made of a second metal over the first layer, in which the first metal and the second metal are made of different materials. For example, first metal may be titanium (Ti) having a thickness in a range from about 9 nm to about 11 nm (e.g., 10 nm), and the second metal may be gold (Au) having a thickness in a range from about 90 nm to about 110 nm (e.g., 100 nm).

Reference is made to FIG. 11B, in which FIG. 11B is an enlarged view of FIG. 11A. In some embodiments, because the gaps G1 under the patterned mask M1 are too small, the metal layer 130 may not be able to form in the gaps G1. Instead, the metal layer 130 may seal the gaps G1 and leaves the gaps G1 remaining unfilled after the deposition of metal layer 130. Accordingly, the portion 121 of the 2-D material layer 120 is laterally separated from the metal layer 130 by the gaps G1.

Figure 12A:
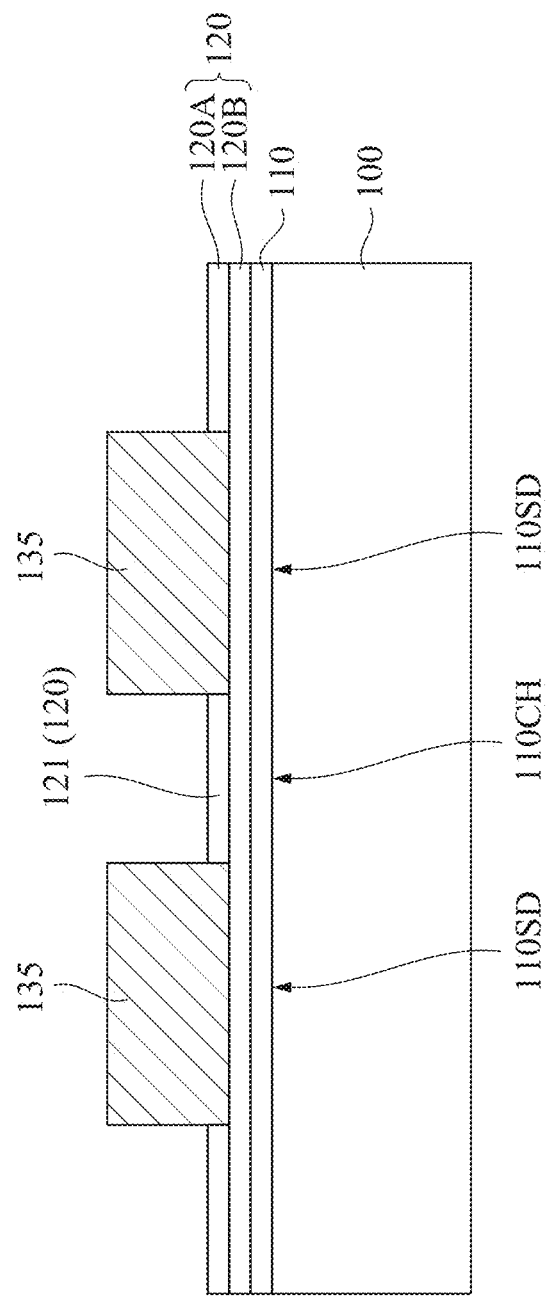
Figure 12B:
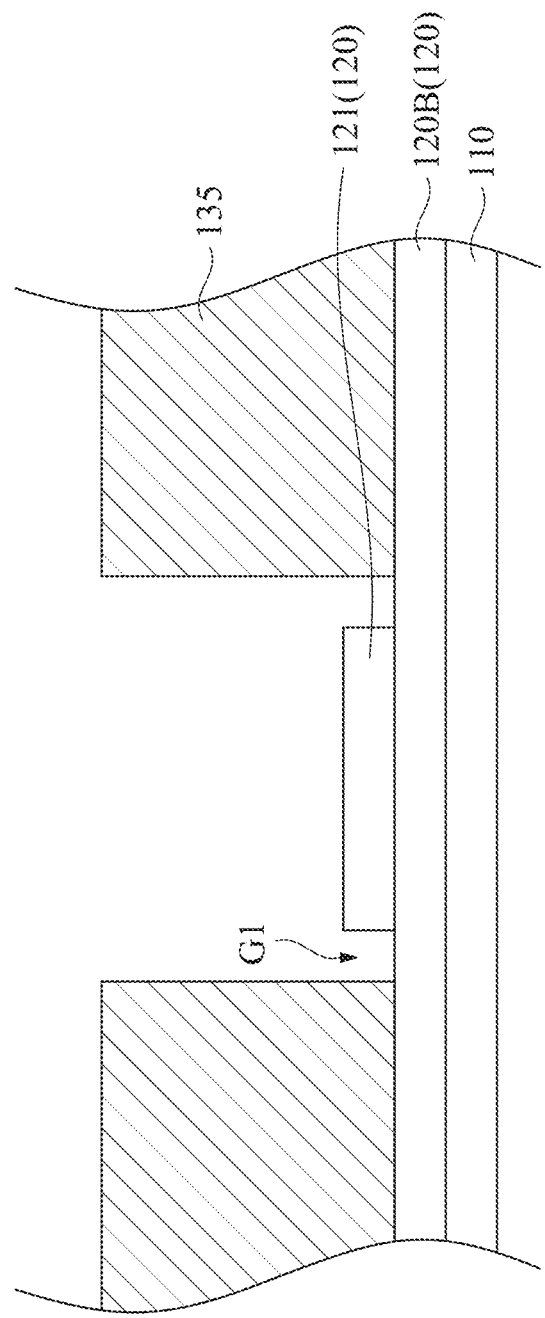

Reference is made to FIGS. 12A and 12B, in which FIG. 12B is an enlarged view of FIG. 12A. The patterned mask M1 may be removed, while leaving portions of the metal layer 130 (see FIGS. 11A and 11B) remaining over the 2-D material layer 120 and covering the source/drain regions 110SD of the 2-D material layer 110. In some embodiments, the remaining portions of the metal layer 130 are substantially align with the source/drain regions 110SD of the 2-D material layer 110, respectively, and the remaining portions of the metal layer 130 may be referred as source/drain contacts 135. In some embodiments, the top surface of each source/drain contact 135 is higher than the top surface of the portion 121 of the 2-D material layer 120, while the bottom surface of each source/drain contact 135 may be level with the bottom surface of the portion 121 of the 2-D material layer 120.

Reference is made to FIG. 12B, in which FIG. 12B is an enlarged view of FIG. 12A. In some embodiments, after the source/drain contacts 135 are formed, the source/drain contacts 135 are disposed on opposite sides of the portion 121 of the 2-D material layer 120, and are laterally separated from the portion 121 of the 2-D material layer 120 by the gaps G1. Furthermore, after the patterned mask M1 is removed, the top ends of the gaps G1 are exposed.

Figure 13:
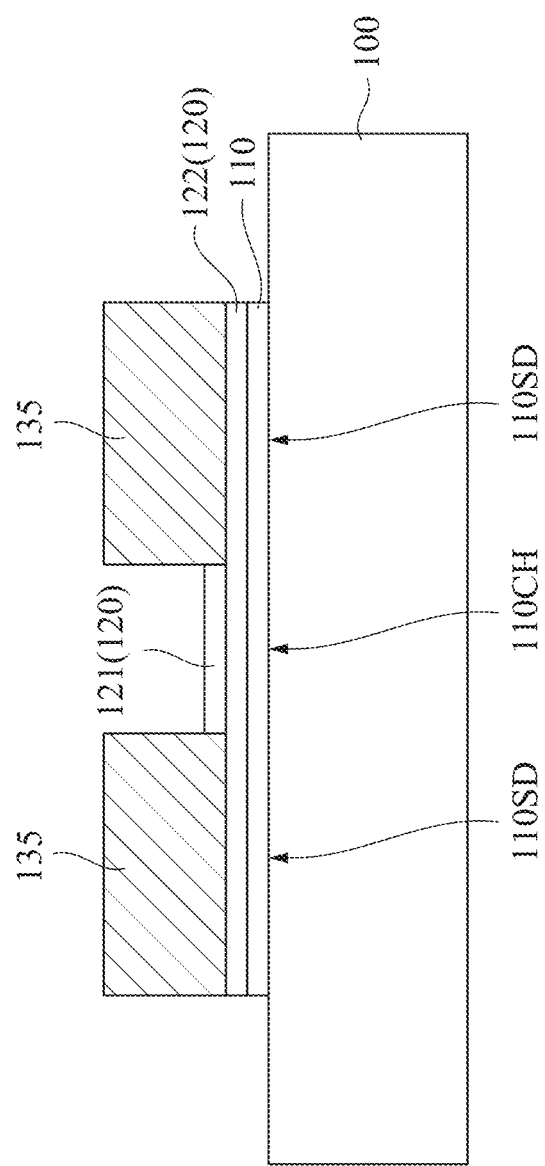

Reference is made to FIG. 13. The 2-D material layer 110 and the 2-D material layer 120 are patterned to define an active layer of the 2-D material layer 110. In greater details, portions of the 2-D material layer 110 other than the channel region 110CH and the source/drain regions 110SD are removed during the patterning process. For example, portions of the 2-D material layer 110 and 120 under the source/drain contacts 135 and portions of the 2-D material layer 110 and 120 between the source/drain contacts 135 are protected during the patterning process and remain over the substrate 100 after the patterning process.

After the patterning process, the portion 121 of the 2-D material layer 120 can be referred to as a 2-D material layer 121. Furthermore, the bottom portion 120B of the 2-D material layer 120 can be referred to as a 2-D material layer 122. In some embodiments, the 2-D material layers 121 and 122 are made of the same 2-D material, such as TMD. The 2-D material layers 121 and 122 may be made of a different material from the 2-D material layer 110. In some embodiments, the 2-D material layer 121 is narrower than the 2-D material layer 122. In some embodiments, the source/drain contacts 135 may be in contact with the top surface of the 2-D material layer 122, while the source/drain contacts 135 may be laterally separated from the 2-D material layer 121 (see FIG. 12B).

Figure 14A:
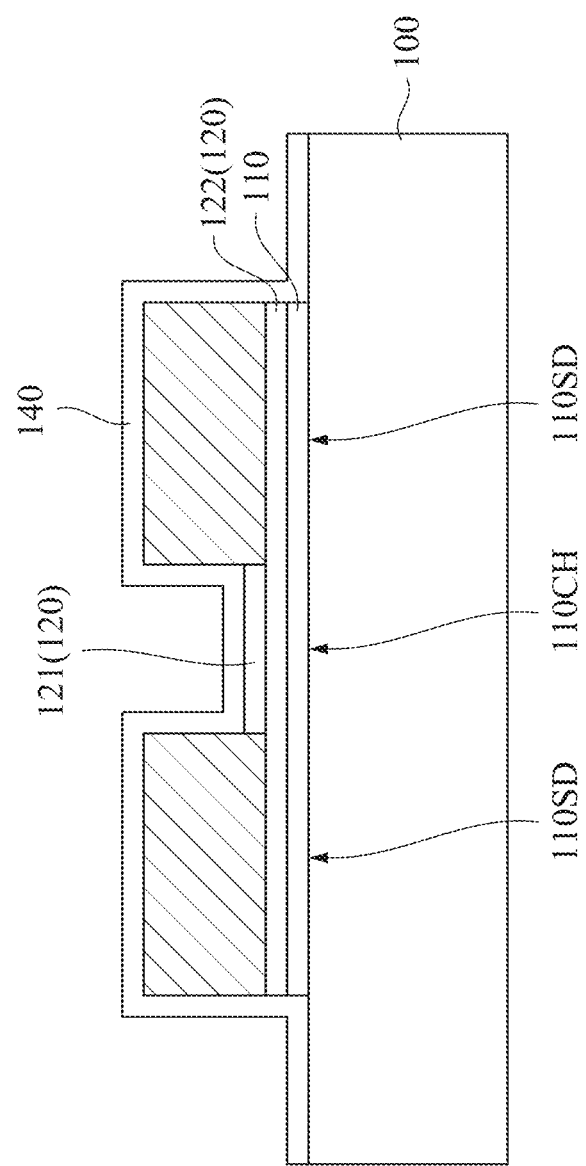
Figure 14B:
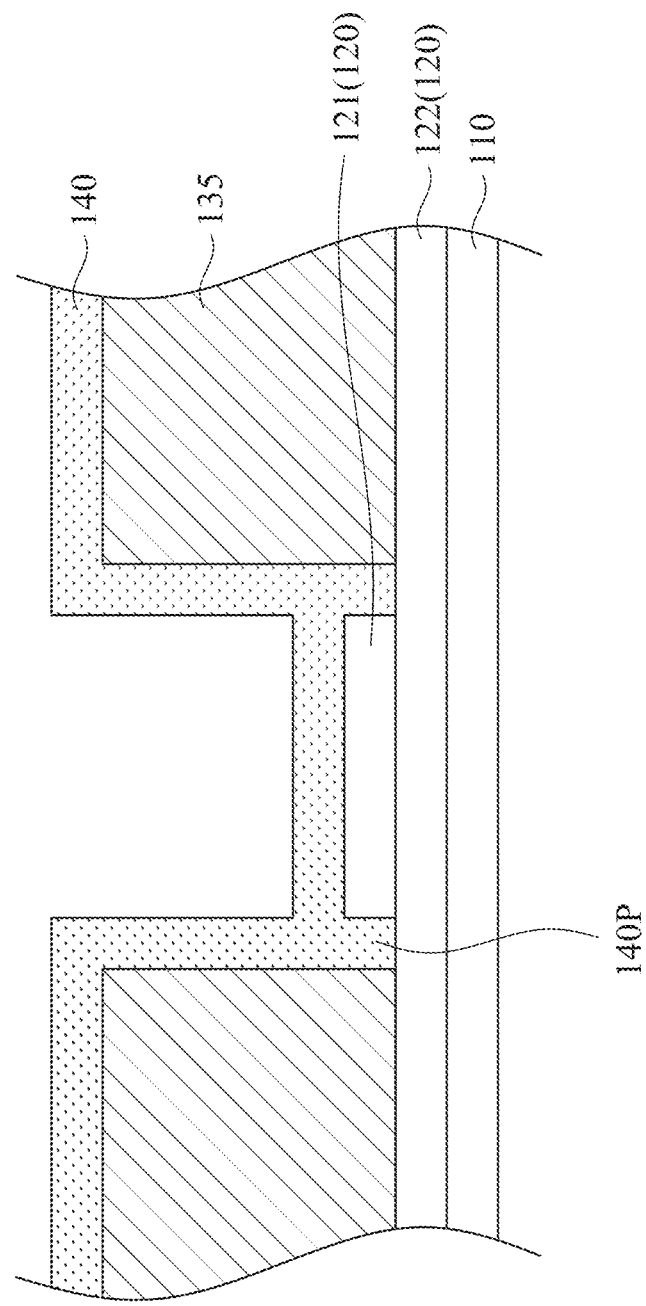

Reference is made to FIGS. 14A and 14B, in which FIG. 14B is an enlarged view of FIG. 14A. A gate dielectric layer 140 is formed over the substrate 100. In greater details, the gate dielectric layer 140 is formed in contact with the 2-D material layer 121 and covering the channel region 110CH of the 2-D material layer 110. Moreover, the gate dielectric layer 140 is formed lining opposite sidewalls of each source/drain contacts 135, lining opposite sidewalls of the 2-D material layer 110 and opposite sidewalls of the 2-D material layer 122, and further extending to exposed surface of the substrate 100.

In some embodiments where the gate dielectric layer 140 is made of aluminum oxide ($Al_2O_3$), the gate dielectric layer 140 made be formed by depositing a 5 nm thin $Al_2O_3$ film by e-beam deposition, and then depositing a 5 nm $Al_2O_3$ film by ALD process. The e-beam deposition is a physical deposition process that can deposit the $Al_2O_3$ film over the substrate, and the precursors of the following ALD process can properly adhere to the surface of the pre-deposited $Al_2O_3$ film, therefore ensuring a better film distribution over the substrate.

Reference is made to FIG. 14B, in which FIG. 14B is an enlarged view of FIG. 14A. In some embodiments, during depositing the gate dielectric layer 140, the gate dielectric layer 140 may filled into the gaps G1 (see FIG. 12B) between the 2-D material layer 121 and the source/drain contacts 135. As a result, the gate dielectric layer 140 may include protrusion portions 140P each extends to a position laterally between the 2-D material layer 121 and a corresponding source/drain contact 135. That is, each source/drain contact 135 is laterally separated from the 2-D material layer 121 by the protrusion portion 140P of the gate dielectric layer 140. In some embodiments, the protrusion portions 140P of the gate dielectric layer 140 may be in contact with the top surface of the 2-D material layer 122.

Figure 15:
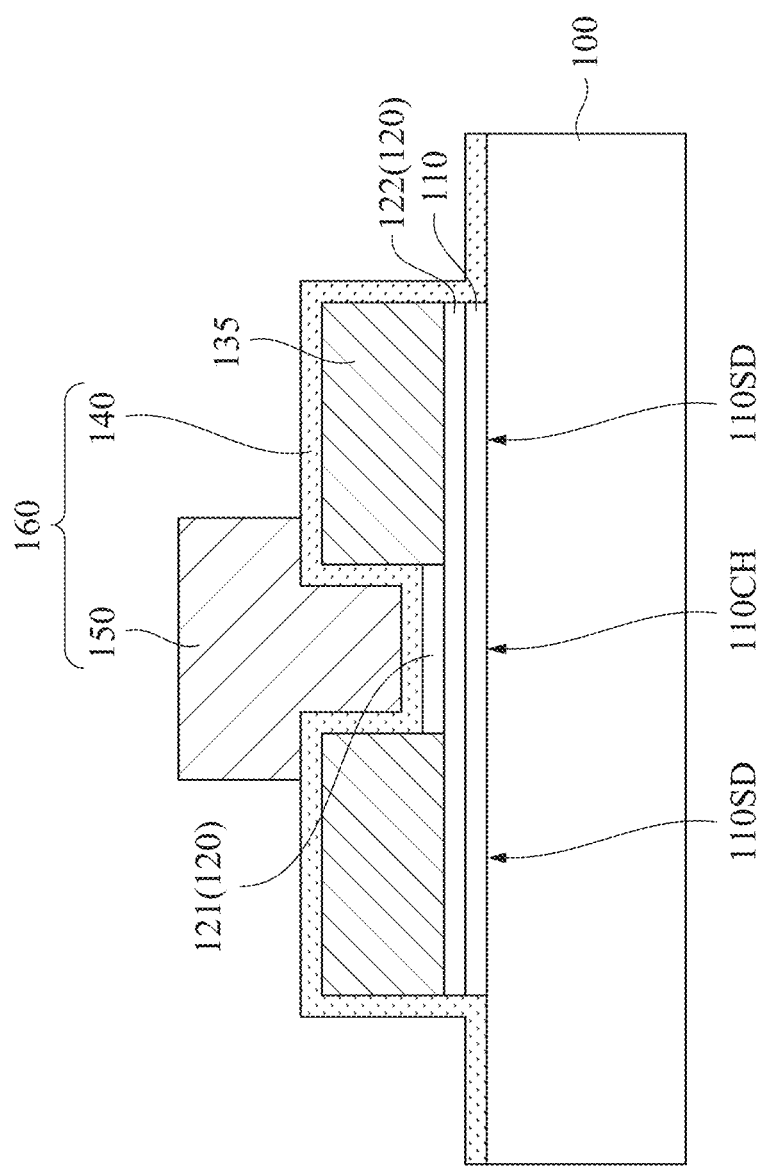

Reference is made to FIG. 15. A gate electrode 150 is formed over the gate dielectric layer 140. The gate electrode 150 is formed covering the channel region 110CH of the 2-D material layer 110, and further extending to positions vertically above the top surfaces of the source/drain contacts 135. The gate dielectric layer 140 and the gate electrode 150 may be collectively referred to as a gate structure 160.

Figure 16:
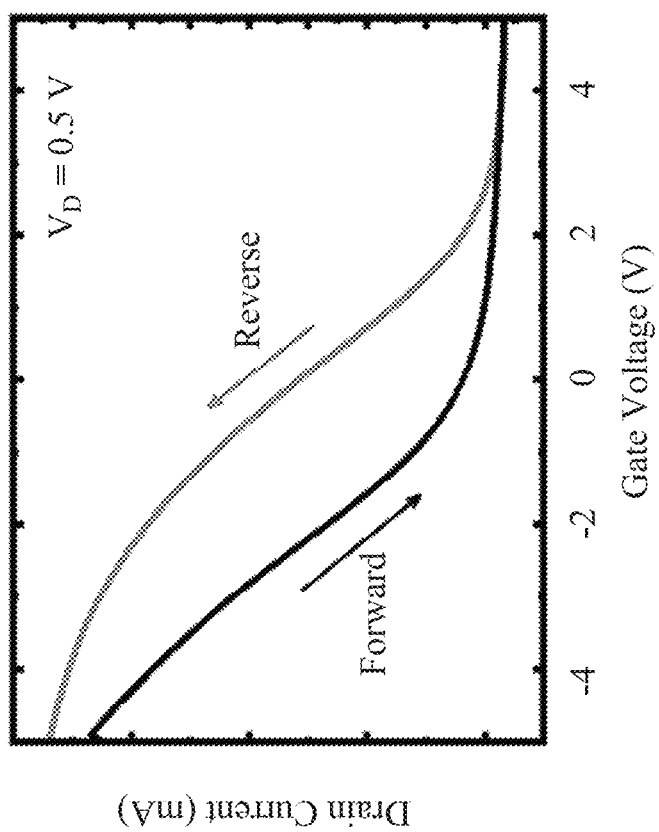
FIG. 16 illustrates an $I_D$-$V_{GS}$ curve of the semiconductor device in accordance with some embodiments of the present disclosure.

FIG. 16 illustrates an $I_D$-$V_{GS}$ curve of the semiconductor device shown in FIG. 15. The forward and reverse transfer curves of the semiconductor device of FIG. 15 at VDS=0.5 V are shown. As shown in the figure, a hysteresis loop is observed for the device. A possible mechanism for this phenomenon is the build-in potential resulted from the charged $MoS_2$ layer (e.g., the 2-D material layer 121). Under forward biases, at negative gate biases, electrons in the isolated $MoS_2$ layer are depleted. The depleted $MoS_2$ layer will depress the hole accumulation in the graphene channel (e.g., the 2-D material layer 110) such that a lower drain current is observed. At positive gate biases, the charged $MoS_2$ layer will depress the electron accumulation in the graphene channel such that no electron modulation is observed with increasing gate voltages. Under reverse biases, at positive gate voltages, the charged $MoS_2$ layer will induce hole accumulation such that a positive threshold voltage is observed for the device. The same mechanism will also induce a higher hole current at $V_{GS}$=0 V. The results suggest that the less conductive isolated topmost $MoS_2$ layer (e.g., the 2-D material layer 121) may act as an effect charge storage layer, and the semiconductor device of FIG. 15 may serve as a memory device.

Figure 17:
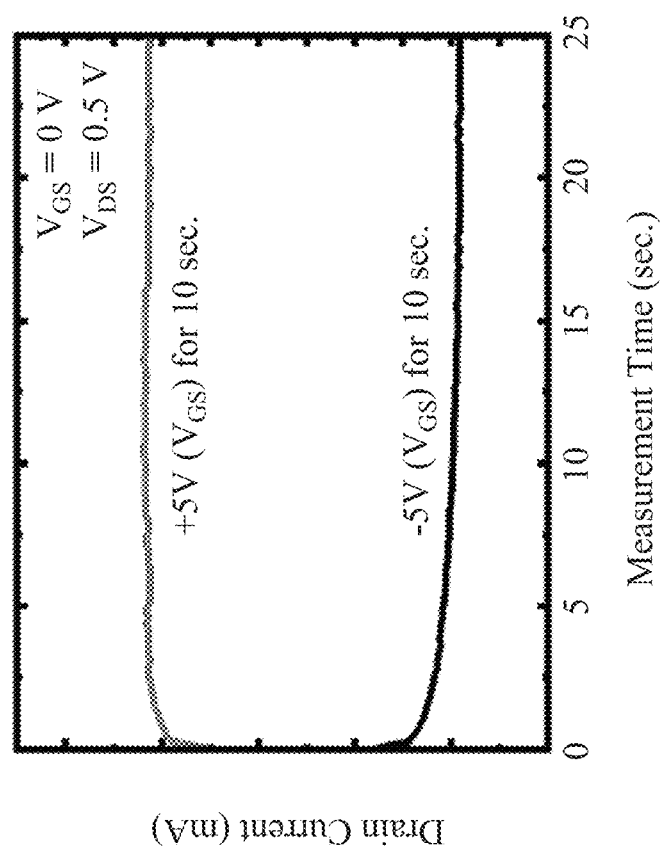
FIG. 17 illustrates an $I_D$-Measurement time curve of the semiconductor device in accordance with some embodiments of the present disclosure.

FIG. 17 illustrates an $I_D$-Measurement time curve of the semiconductor device shown in FIG. 15. As shown in the figure, after a +5.0 V gate voltage applied to the device for about 10 sec., higher drain currents are observed for the device at $V_{GS}$=0 V. After a −5.0 V gate voltage applied to the device for about 10 sec., lower drain currents are observed. The current separation is kept up to tens of seconds. The results are consistent with the observation from the device's transfer curve of FIG. 16. When the $MoS_2$ layer (e.g., the 2-D material layer 121) is charged with electrons (positive gate biases; write), a "1" state is observed for the device at $V_{GS}$=0 V. When electrons are depleted from the $MoS_2$ layer (negative gate biases; erase), a "0" state is observed for the device at $V_{GS}$=0 V. The long retention time for the "0" and "1" states of the device suggests that an effective electron storage in the isolated $MoS_2$ layer. The van der Waals interface between $MoS_2$ and graphene will prevent charge transfer when no external electrical fields are applied to the charge storage layer.

Figure 18:
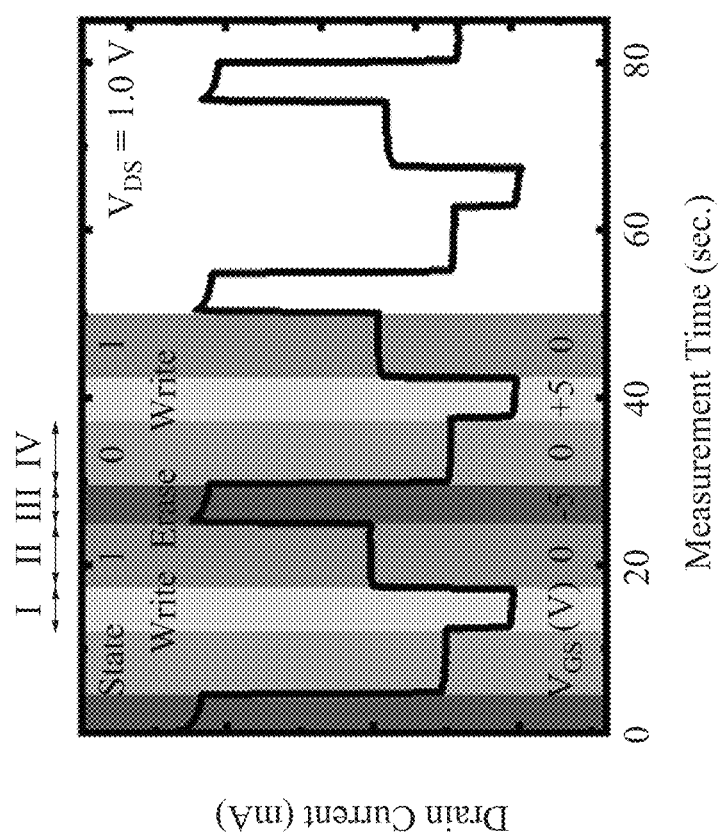
FIG. 18 illustrates an $I_D$-Measurement time curve of the semiconductor device in accordance with some embodiments of the present disclosure.

FIG. 18 illustrates an $I_D$-Measurement time curve of the semiconductor device shown in FIG. 15. FIG. 19A, 19B, 19C, and 19D illustrate current conduction mechanism at different stages in accordance with some embodiments of the present disclosure.

Figure 19A:
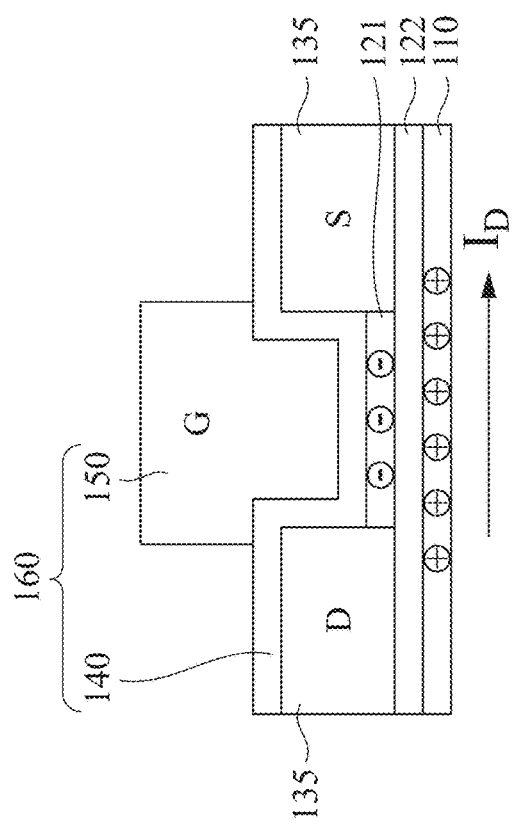
FIG. 19A, 19B, 19C, and 19D illustrate current conduction mechanism at different stages in accordance with some embodiments of the present disclosure.

Referring to FIGS. 18 and 19A, in stage I of FIG. 18, a write operation is performed. When a positive gate bias (e.g., about +5V) is applied, electrons are accumulated in the isolated $MoS_2$ layer (e.g., the 2-D material layer 121). Higher hole concentration will be observed in a p-type graphene channel (e.g., the 2-D material layer 110) due to the attraction of the storage electrons.

Figure 19C:
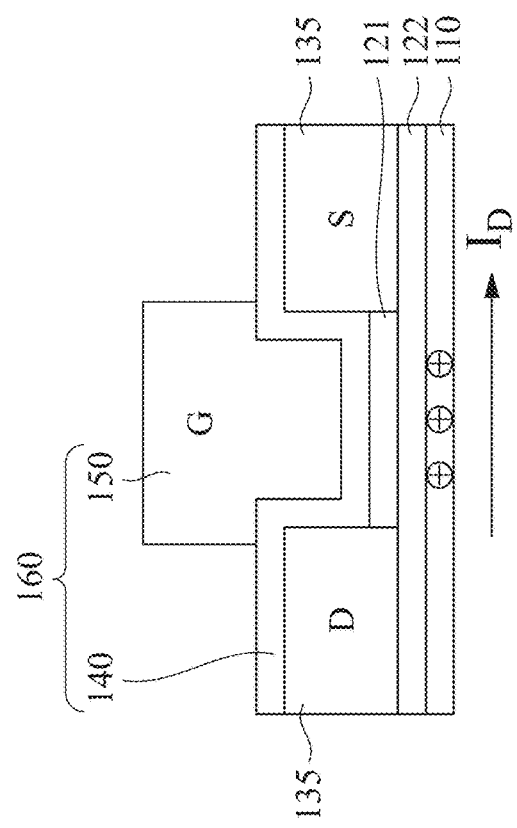
Figure 19B:
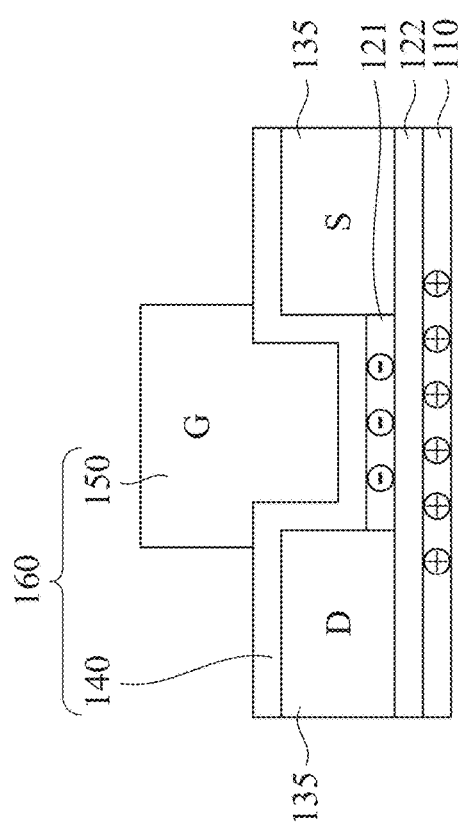

Referring to FIGS. 18 and 19B, in stage II of FIG. 18, a read operation is performed. A higher drain current will be observed with applied drain voltages, which will correspond to a "1" state.

Referring to FIGS. 18 and 19C, in stage III of FIG. 18, an erase operation is performed. When a negative gate bias (e.g., about −5V) is applied, electrons are repelled from the isolated $MoS_2$ layer (e.g., the 2-D material layer 121). Lower hole concentration will be observed in the p-type graphene channel (e.g., the 2-D material layer 110).

Figure 19D:
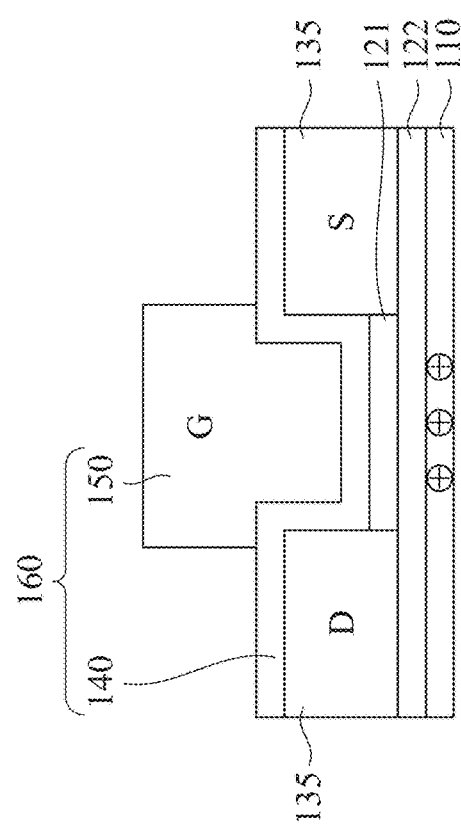

Referring to FIGS. 18 and 19D, in stage IV of FIG. 18, a read operation is performed. A lower drain current is observed when the same drain voltage is applied. This will correspond to a "0" state for the memory device.

Consequently, the applied positive and negative gate biases would correspond to write and erase process of the memory device, respectively. The repeating operation of the device also indicates a potential application for a memory device.

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. One advantage is that a 2-D passivation layer is inserted between a 2-D channel layer and a gate dielectric layer, the 2-D passivation layer can act as a protective layer for the 2-D channel layer, so as to prevent the 2-D channel layer from damage during forming the gate dielectric layer, and will further improve the device performance and reliability. Another advantage is that, an isolated 2-D material layer disposed over the 2-D passivation layer can act as a charge storage layer, which makes the device possible to serve as a memory device.

In some embodiments of the present disclosure, a semiconductor device includes a substrate, a 2-D material channel layer, a 2-D material passivation layer, source/drain contacts, and a gate structure. The 2-D material channel layer is over the substrate, wherein the 2-D material channel layer is made of graphene. The 2-D material passivation layer is over the 2-D material channel layer, wherein the 2-D material passivation layer is made of transition metal dichalcogenide (TMD). The source/drain contacts are over the 2-D material passivation layer. The gate structure is over the 2-D material passivation layer and between the source/drain contacts. In some embodiments, the semiconductor device further includes a charge storage layer over the 2-D material passivation layer, wherein the charge storage layer is made of TMD. In some embodiments, the 2-D material passivation layer and the charge storage layer are made of a same TMD material. In some embodiments, the charge storage layer is narrower than the 2-D material passivation layer. In some embodiments, the gate structure comprises a gate dielectric layer and a gate electrode over the gate dielectric layer, and the gate dielectric layer is in contact with the 2-D material passivation layer and the source/drain contacts. In some embodiments, the gate dielectric layer of the gate structure is vertically separated from a channel region of the 2-D material channel layer by the 2-D material passivation layer. In some embodiments, the source/drain contacts are in contact with a top surface of the 2-D material passivation layer. In some embodiments, the source/drain contacts are vertically separated from the 2-D material channel layer by the 2-D material passivation layer.

In some embodiments of the present disclosure, a memory device includes a substrate, a channel layer, a 2-D material passivation layer, a 2-D material charge storage layer, source/drain contacts, and a gate structure. The channel layer is over the substrate. The 2-D material passivation layer is over the channel layer. The 2-D material charge storage layer is over the 2-D material passivation layer. The source/drain contacts are over the 2-D material passivation layer and on opposite sides of the 2-D material charge storage layer. The gate structure is over the 2-D material charge storage layer and between the source/drain contacts. In some embodiments, the 2-D material passivation layer and the 2-D material charge storage layer are made of a same first 2-D material. In some embodiments, the channel layer is made of a 2-D material different from 2-D materials of the 2-D material passivation layer and the 2-D material charge storage layer. In some embodiments, the 2-D materials of the 2-D material passivation layer and the 2-D material charge storage layer are less conductive than the 2-D material of the channel layer. In some embodiments, the 2-D material charge storage layer and the source/drain contacts are in contact with a top surface of the 2-D material passivation layer. In some embodiments, the 2-D material charge storage layer is narrower than the 2-D material passivation layer and the channel layer. In some embodiments, the 2-D material charge storage layer is laterally separated from the source/drain contacts. In some embodiments, the 2-D material charge storage layer includes one or more mono-layer(s) of 2-D material, such as about 1 to 10 mono-layer(s) of 2-D material.

In some embodiments of the present disclosure, a method includes forming a graphene layer over a substrate; forming a transition metal dichalcogenide (TMD) layer over the graphene layer; forming a patterned mask having openings exposing a top surface of the TMD layer; forming source/drain contacts in the openings; removing the patterned mask; and forming a gate structure over the TMD layer and between the source/drain contacts. In some embodiments, the method further includes etching a top portion of the TMD layer prior to forming the source/drain contacts. In some embodiments, etching the top portion of the TMD layer includes oxidizing the top portion of the TMD layer; removing the oxidized top portion of the TMD layer; and after removing the oxidized top portion of the TMD layer, performing a re-sulfurization process to the TMD layer. In some embodiments, forming the TMD layer includes performing a deposition process without using plasma treatment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
   forming a graphene layer over a substrate;
   forming a transition metal dichalcogenide (TMD) layer over the graphene layer;
   forming a patterned mask having openings exposing a top surface of the TMD layer;
   removing a portion of the TMD layer through the openings of the patterned mask;
   forming source/drain contacts in the openings, wherein a remaining portion of the TMD layer is in contact with bottom surfaces and sidewalls of the source/drain contacts;
   removing the patterned mask; and
   forming a gate structure over the TMD layer and between the source/drain contacts.

2. The method of claim 1, further comprising etching a top portion of the TMD layer prior to forming the source/drain contacts.

3. The method of claim 2, wherein etching the top portion of the TMD layer comprises:
   oxidizing the top portion of the TMD layer;
   removing the oxidized top portion of the TMD layer; and
   after removing the oxidized top portion of the TMD layer, performing a re-sulfurization process to the TMD layer.

4. The method of claim 1, wherein forming the TMD layer comprises performing a deposition process without using plasma treatment.

5. A method, comprising:
   forming a 2-D material channel layer over a substrate, wherein the 2-D material channel layer is made of graphene;
   forming a 2-D material passivation layer over the 2-D material channel layer, wherein the 2-D material passivation layer is made of transition metal dichalcogenide (TMD);
   forming a 2-D material charge storage layer over the 2-D material passivation layer;
   forming source/drain contacts over the 2-D material passivation layer, wherein the source/drain contacts are in contact with opposite ends of the 2-D material charge storage layer; and
   forming a gate structure over the 2-D material passivation layer and between the source/drain contacts.

6. The method of claim 5, wherein the 2-D material charge storage layer is made of TMD.

7. The method of claim 6, wherein the 2-D material passivation layer and the 2-D material charge storage layer are made of a same TMD material.

8. The method of claim 6, wherein the 2-D material charge storage layer is narrower than the 2-D material passivation layer.

9. The method of claim 5, wherein the gate structure comprises a gate dielectric layer and a gate electrode over the gate dielectric layer, and the gate dielectric layer is in contact with the 2-D material passivation layer and the source/drain contacts.

10. The method of claim 9, wherein the gate dielectric layer of the gate structure is vertically separated from a channel region of the 2-D material channel layer by the 2-D material passivation layer.

11. The method of claim 5, wherein the source/drain contacts are in contact with a top surface of the 2-D material passivation layer.

12. The method of claim 5, wherein the source/drain contacts are vertically separated from the 2-D material channel layer by the 2-D material passivation layer.

13. A method, comprising:
forming a channel layer over a substrate;
forming a 2-D material passivation layer over the channel layer;
forming a 2-D material charge storage layer over the 2-D material passivation layer;
forming source/drain contacts over the 2-D material passivation layer and on opposite sides of the 2-D material charge storage layer; and
forming a gate structure over the 2-D material charge storage layer and between the source/drain contacts, wherein the gate structure has a gate dielectric layer in contact with a top surface of the 2-D material charge storage layer, a sidewall of the 2-D material charge storage layer, and a top surface of the 2-D material passivation layer.

14. The method of claim 13, wherein the 2-D material passivation layer and the 2-D material charge storage layer are made of a same first 2-D material.

15. The method of claim 14, wherein the channel layer is made of a 2-D material different from 2-D materials of the 2-D material passivation layer and the 2-D material charge storage layer.

16. The method of claim 15, wherein the 2-D materials of the 2-D material passivation layer and the 2-D material charge storage layer are less conductive than the 2-D material of the channel layer.

17. The method of claim 13, wherein the 2-D material charge storage layer and the source/drain contacts are in contact with a top surface of the 2-D material passivation layer.

18. The method of claim 13, wherein the 2-D material charge storage layer is narrower than the 2-D material passivation layer and the channel layer.

19. The method of claim 13, wherein the 2-D material charge storage layer is laterally separated from the source/drain contacts.

20. The method of claim 13, wherein the 2-D material charge storage layer includes one or more mono-layer(s) of 2-D material.

* * * * *